United States Patent
Lu et al.

(10) Patent No.: US 12,184,164 B2
(45) Date of Patent: Dec. 31, 2024

(54) MULTI-PHASE BUCK CONVERTER CIRCUIT, FAULT DETECTION METHOD AND APPARATUS THEREOF, AND STORAGE MEDIUM

(71) Applicant: HUAWEI TECHNOLOGIES CO., LTD., Guangdong (CN)

(72) Inventors: Yuliang Lu, Dongguan (CN); Wenbo Zhou, Shenzhen (CN); Yuanhui Zheng, Dongguan (CN); Limin Li, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 439 days.

(21) Appl. No.: 17/480,134

(22) Filed: Sep. 20, 2021

(65) Prior Publication Data
US 2022/0006376 A1 Jan. 6, 2022

Related U.S. Application Data

(63) Continuation of application No. PCT/CN2020/078576, filed on Mar. 10, 2020.

(30) Foreign Application Priority Data

Mar. 20, 2019 (CN) .......................... 201910214556.3

(51) Int. Cl.
*H02M 1/36* (2007.01)
*G01R 19/165* (2006.01)
(Continued)

(52) U.S. Cl.
CPC ........ *H02M 1/36* (2013.01); *G01R 19/16566* (2013.01); *G01R 31/40* (2013.01); *H02M 1/08* (2013.01); *H02M 3/155* (2013.01)

(58) Field of Classification Search
CPC ................................ H02M 1/36; H02M 3/155
See application file for complete search history.

(56) References Cited

U.S. PATENT DOCUMENTS

| | | | |
|---|---|---|---|
| 6,031,743 A * | 2/2000 | Carpenter | H02J 1/001 363/124 |
| 2006/0152205 A1* | 7/2006 | Tang | H02M 3/1584 323/284 |

(Continued)

FOREIGN PATENT DOCUMENTS

| | | |
|---|---|---|
| CN | 201369862 Y | 12/2009 |
| CN | 102223749 A | 10/2011 |

(Continued)

OTHER PUBLICATIONS

Meynard T A et al: "Multi-level conversion: high voltage choppers and voltage-source inverters", Proceedings of the Annual Power Electronics Specialists Conference (PESC). 1992 IEEE, Total 7 Pages.

(Continued)

*Primary Examiner* — Jue Zhang
*Assistant Examiner* — Lakaisha Jackson

(57) ABSTRACT

A multi-phase buck converter circuit is provided, including a power supply, a plurality of phase buck circuits, each phase buck circuit including an input terminal, an output terminal, and a second input terminal, with input terminals of the plurality coupled to the power supply, a plurality of inductors coupled to the output terminals of the plurality of phase buck circuits, the plurality of inductors providing an output voltage at an output of the multi-phase buck converter circuit, a detection controller coupled to the output terminals of the plurality of phase buck circuits, the detection controller configured to detect a fault in the plurality of phase buck circuits, and a drive circuit coupled to the detection controller and coupled to each second input terminal of the (Continued)

plurality of phase buck circuits. The drive circuit is configured to detect a faulty phase buck circuit and stop driving the faulty phase buck circuit.

13 Claims, 11 Drawing Sheets

(51) Int. Cl.
*G01R 31/40* (2020.01)
*H02M 1/08* (2006.01)
*H02M 3/155* (2006.01)

(56) References Cited

U.S. PATENT DOCUMENTS

| | | | |
|---|---|---|---|
| 2010/0127679 A1 | 5/2010 | Satterfield | |
| 2014/0002932 A1* | 1/2014 | Tang | H02M 1/32 |
| | | | 361/18 |

FOREIGN PATENT DOCUMENTS

| | | |
|---|---|---|
| CN | 103066835 A | 4/2013 |
| CN | 103606894 A | 2/2014 |
| CN | 105450009 A | 3/2016 |
| CN | 105490326 A | 4/2016 |
| CN | 105703322 A | 6/2016 |
| CN | 107396484 A | 11/2017 |
| CN | 110034543 A | 7/2019 |
| DE | 112016001334 T5 | 12/2017 |

OTHER PUBLICATIONS

Michael Gleissner et al.,"Design and Control of Fault-Tolerant Nonisolated Multiphase Multilevel DC-DC Converters for Auto1notive Power Systen1s",IEEE Iransac Jons on Industry Applications, vol. 52, No. 2, Mar./Apr. 2016, Total 11 Pages.

* cited by examiner

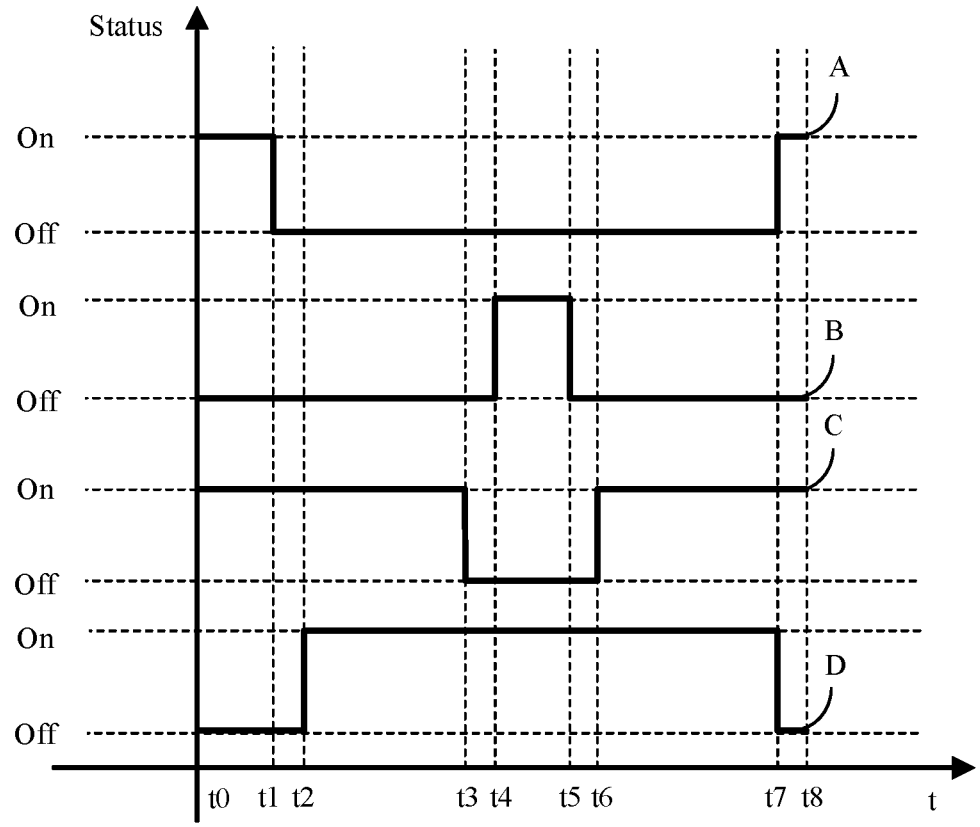
FIG. 7    700
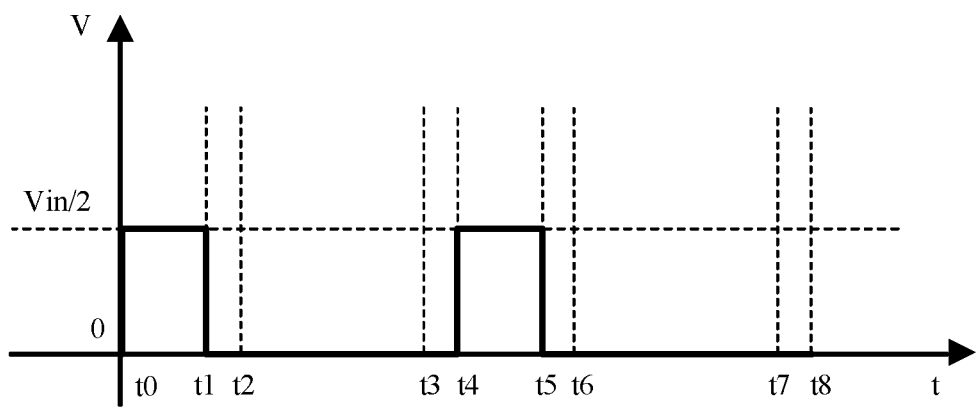
FIG. 8    800

MULTI-PHASE BUCK CONVERTER CIRCUIT, FAULT DETECTION METHOD AND APPARATUS THEREOF, AND STORAGE MEDIUM

CROSS-REFERENCE TO RELATED APPLICATIONS

This application is a continuation of International Application No. PCT/CN2020/078576, filed on Mar. 10, 2020, which claims priority to Chinese Patent Application No. 201910214556.3, filed on Mar. 20, 2019. The disclosures of the aforementioned applications are hereby incorporated by reference in their entireties.

TECHNICAL FIELD

This application relates to the field of electronic technologies, and in particular, to a multi-phase buck converter, a fault detection method and apparatus thereof, and a storage medium.

BACKGROUND

FIG. 1 shows a conventional multi-phase buck converter circuit 100, a power supply circuit widely used in a microprocessor. As shown in the figure, the multi-phase buck converter circuit 100 includes phase buck circuits 3, wherein multiple phase buck circuits 3 are combined to form the multi-phase aspect of the multi-phase buck converter circuit 100. Each phase buck circuit 3 is operated at different time intervals and the "multi-phase" nature of the multi-phase buck converter circuit 100 is created by including multiple such phase buck circuits 3. The multi-phase buck converter circuit 100 includes a power supply 1, a load 2, a plurality of phase buck circuits 3, corresponding inductors 4 for each phase buck circuit 3, and a capacitor 5. Although three such phase buck circuits 3 are shown, it should be understood that a greater (or lesser) number N of phase buck circuits 3 can be included in the multi-phase buck converter circuit 100. Each phase buck circuit 3 includes two metal-oxide-semiconductor (MOS) transistors 8 and 9. To reduce a voltage ripple, the multi-phase buck circuits may alternately be turned on and off based on a specific time sequence, the sequence of individual time-energized phase buck circuits being combined and contributing to the overall power output to continuously supply power to the load 2. However, when any MOS transistor in any one of the phase buck circuits 3 in the conventional multi-phase buck converter circuit 100 is short-circuited, the phase buck circuit in which the MOS transistor is located is faulty. Consequently, the load 2 cannot work normally. For example, in FIG. 1, each phase buck circuit 3 may include an upper MOS transistor 8 whose drain dl is connected to a positive electrode of the power supply 1, and a lower MOS transistor 9 whose source s2 is grounded. When the lower MOS transistor 9 in any of the phase buck circuits 3 is short-circuited, the entire multi-phase buck converter circuit 100 is short-circuited, and the load 2 cannot operate normally. In addition, when the upper MOS transistor 8 in any of the phase buck circuits 3 is short-circuited, an input voltage may be directly applied to the load 2 through the upper MOS transistor 8, and the load 2 may fail due to overvoltage, that is, the load 2 cannot operate normally. Therefore, a fault detection method for a multi-phase buck converter circuit 100 is urgently needed, to detect whether each MOS transistor 8 or 9 in the multi-phase buck converter circuit 100 is faulty. When any MOS transistor 8 or 9 is faulty, a phase buck circuit 3 in which the MOS transistor is located can be isolated in time. This avoids a case in which the load cannot work normally because the phase buck circuit 3 is faulty.

SUMMARY

This application provides a multi-phase buck converter circuit, a fault detection method and apparatus thereof, and a storage medium, to resolve a problem in a related technology that a load cannot work normally when any MOS transistor in any phase buck circuit included in the multi-phase buck converter circuit is short-circuited. The technical solutions are as follows:

According to a first aspect, a multi-phase buck converter circuit is provided. The multi-phase buck converter circuit includes: a power supply, N number of phase buck circuits, N inductors, a first capacitor, a load, a detection controller, a drive circuit, and a second capacitor. A fault detection point of each phase buck circuit corresponds to different voltages at different time points, the N phase buck circuits are in one-to-one correspondence with the N inductors, and N is a positive integer greater than or equal to 2. A positive electrode of the power supply is connected to a first input terminal of the N phase buck circuit, a first output terminal of the N phase buck circuit is connected to a first terminal of a corresponding inductor in the N inductors, a second terminal of the N inductor is connected to a first terminal of the first capacitor, a second output terminal of the N phase buck circuit and a second terminal of the first capacitor are connected to a negative electrode of the power supply, the load is connected in parallel to the two terminals of the first capacitor, and the second capacitor is connected in parallel between the positive electrode and the negative electrode of the power supply. An input terminal of the detection controller is connected to the fault detection point of each phase buck circuit in the N phase buck circuits, an output terminal of the detection controller is connected to an input terminal of the drive circuit, an output terminal of the drive circuit is connected to a second input terminal of the N phase buck circuit, the detection controller is configured to detect, based on the voltage at the fault detection point of each phase buck circuit in the N phase buck circuits, whether a fault occurs, and the drive circuit is configured to: drive the N phase buck circuits to work alternately, and when the detection controller determines that any one of the N phase buck circuits is faulty, stop driving the any one of the phase buck circuits.

It should be noted that the power supply may provide electric energy for the load by using the N phase buck circuits, where the power supply may be a direct current power supply or the like. The N phase buck circuits may alternately be on and off based on a specific time sequence, to continuously supply power to the load. In addition, a voltage ripple input by the power supply to the load may be reduced in a manner in which the N phase buck circuits are alternately on and off. Different phase buck circuits in the N phase buck circuits may correspond to different phases, and two adjacent phase buck circuits may have a same phase difference. The phase difference may be obtained by dividing 360 degrees by N. In this case, a use frequency of each phase buck circuit is 1/N.

In addition, the multi-phase buck converter circuit may be a three-level circuit. In a possible implementation, the multi-phase buck converter circuit may alternatively be a five-level circuit. This is not limited in this embodiment of this application. In addition, when preventing a current from passing through, the inductor may temporarily store electric energy in a form of a magnetic field. When the current in the circuit reduces, the inductor may release the temporarily stored energy. The first capacitor and the second capacitor may filter an input current of the load, to reduce noise of the input current of the load and improve smoothness of the input current of the load. Types, models, and the like of the inductor, the first capacitor, and the second capacitor may be preset based on a use requirement. The load may be a chip or the like. This is not limited in this embodiment of this application.

In this application, because the fault detection point of each phase buck circuit may correspond to different voltages at different time points, the detection controller may synchronously detect the voltage at the fault detection point of each phase buck circuit, to synchronously detect whether each phase buck circuit is faulty. When the detection controller determines that the any one of the phase buck circuits is faulty, the drive circuit may stop driving the phase buck circuit. This implements isolation of the phase buck circuit, and avoids a case in which the load cannot work normally because the phase buck circuit is faulty.

Optionally, for the any one of the N phase buck circuits, the phase buck circuit includes a first MOS transistor, a second MOS transistor, a third MOS transistor, a fourth MOS transistor, and a third capacitor. A drain of the first MOS transistor is connected to the positive electrode of the power supply, a source of the first MOS transistor is respectively connected to a drain of the second MOS transistor and to a first terminal of the third capacitor, a source of the second MOS transistor is respectively connected to a drain of the third MOS transistor and to a first terminal of an inductor corresponding to the any one of the phase buck circuits, a source of the third MOS transistor is respectively connected to a drain of the fourth MOS transistor and to a second terminal of the third capacitor, a source of the fourth MOS transistor is connected to the negative electrode of the power supply, and a connection point between the source of the second MOS transistor and the drain of the third MOS transistor is used as the fault detection point of the phase buck circuit.

The output terminal of the drive circuit is connected to a gate of the first MOS transistor, a gate of the second MOS transistor, a gate of the third MOS transistor, and a gate of the fourth MOS transistor, and the drive circuit is configured to drive the first MOS transistor, the second MOS transistor, the third MOS transistor, and the fourth MOS transistor to be on or off.

It should be noted that the first MOS transistor, the second MOS transistor, the third MOS transistor, and the fourth MOS transistor are all metal-oxide-semiconductor field-effect transistors. A function of any one of the four MOS transistors in the buck circuit may be equivalent to that of a switch. In other words, that any one of the MOS transistors is on is equivalent to that a switch is on, and that any one of the MOS transistors is off is equivalent to that a switch is off. The first MOS transistor, the second MOS transistor, the third MOS transistor, and the fourth MOS transistor may all be N-type MOS transistors, P-type MOS transistors, or the like. In addition, a body diode may be disposed on each MOS transistor. A function of the body diode may be: When a phase buck circuit in which the MOS transistor is located has a reverse induced voltage, the reverse induced voltage passes through, to prevent the reverse induced voltage from breaking down the MOS transistor.

In addition, the drive circuit may be configured to drive the first MOS transistor, the second MOS transistor, the third MOS transistor, and the fourth MOS transistor that are in different phase buck circuits to be on or off, to drive the N phase buck circuits to work alternately. Because the output terminal of the drive circuit is connected to the gate of the first MOS transistor, the gate of the second MOS transistor, the gate of the third MOS transistor, and the gate of the fourth MOS transistor, when a voltage applied to the gate of any one of the four MOS transistors by the drive circuit is greater than a breakover voltage of the MOS transistor, a conductive channel is formed between the source and the drain of the MOS transistor, electrons may flow from the source to the drain of the MOS transistor through the conductive channel. In other words, a current may flow from the drain to the source of the MOS transistor. In this case, the MOS transistor is on. When a voltage applied to the gate of any one of the four MOS transistors by the drive circuit is less than the breakover voltage of the MOS transistor, the conductive channel is not formed between the source and the drain of the MOS transistor. In other words, the current does not flow from the drain to the source of the MOS transistor. In this case, the MOS transistor is off. To be specific, the drive circuit may control the voltage applied to the gate of the first MOS transistor, the gate of the second MOS transistor, the gate of the third MOS transistor, and the gate of the fourth MOS transistor, to drive the first MOS transistor, the second MOS transistor, the third MOS transistor, and the fourth MOS transistor to be on or off. In addition, the third capacitor is configured to: when the drive circuit drives the first MOS transistor, the second MOS transistor, the third MOS transistor, and the fourth MOS transistor to be on or off, provide a path in which the transistor may alternately be on. The third capacitor may be a flying capacitor or the like, and the third capacitor may be denoted as Cfn or the like. This is not limited in this embodiment of this application.

In addition, during actual application, the first MOS transistor and the second MOS transistor may be connected in series to serve as a dual-upper MOS transistor in the N phase buck circuits, and the third MOS transistor and the fourth MOS transistor are connected in series to serve as a dual-lower MOS transistor in the N phase buck circuits. The dual-upper MOS transistor and the dual-lower MOS transistor may be integrated in a network device, for example, a router or a server.

In this application, the any one of the phase buck circuits includes the first MOS transistor, the second MOS transistor, the third MOS transistor, the fourth MOS transistor, and the third capacitor. When the drive circuit drives the first MOS transistor, the second MOS transistor, the third MOS transistor, and the fourth MOS transistor to be on or off, the third capacitor may provide the path in which the transistor may alternately be on, so that a withstand voltage of each MOS transistor may be reduced, and a service life of each MOS transistor is further prolonged.

Optionally, the drive circuit includes N drive subcircuits, and the N drive subcircuits are in one-to-one correspondence with the N phase buck circuits. Input terminals of the N drive subcircuits are respectively connected to output terminals of the detection controller, and output terminals of the N drive subcircuits are respectively connected to the second input terminal of the N phase buck circuit.

In this application, the drive circuit may include the N drive subcircuits. The N drive subcircuits drive the N phase buck circuits, so that driving of the N phase buck circuits can be more efficient.

According to a second aspect, a fault detection method of a multi-phase buck converter circuit is provided. The method includes: detecting a voltage at a fault detection point of a phase buck circuit in a current detection period;

determining, based on the voltage in the current detection period, whether the phase buck circuit is currently faulty; and if the phase buck circuit is currently faulty, sending a disable driving signal to the drive circuit, to indicate the drive circuit to stop driving the phase buck circuit.

It should be noted that the phase buck circuit may be any one of N phase buck circuits. The detection period may include a time period in which a first MOS transistor and a third MOS transistor in the phase buck circuit are on, and a time period in which a second MOS transistor and a fourth MOS transistor are on.

In this embodiment of this application, after stopping driving the phase buck circuit, the drive circuit may alternately drive another buck circuit other than the phase buck circuit to be on and off, to continuously supply power to a load. In other words, stopping driving the phase buck circuit does not affect normal working of the multi-phase buck converter circuit.

In some embodiments, the detection period includes a first detection moment and a second detection moment, the first detection moment is a time period in which the first MOS transistor in the phase buck circuit is on, and the second detection moment is a time period in which the second MOS transistor in the phase buck circuit is on. The determining, based on the voltage in the current detection period, whether the phase buck circuit is currently faulty includes: if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtaining voltages in M historical detection periods, where the M historical detection periods and the current detection period are consecutive, M is a positive integer, the first voltage threshold is greater than a half of a voltage of a power supply and less than the voltage of the power supply, and the second voltage threshold is less than the half of the voltage of the power supply and greater than zero; and if the voltages at the first detection moment in the M historical detection periods are all higher than the first voltage threshold, and the voltages at the second detection moment in the M historical detection periods are all lower than the second voltage threshold; or the voltages at the first detection moment in the M historical detection periods are all lower than the second voltage threshold, and the voltages at the second detection moment in the M historical detection periods are all higher than the first voltage threshold, determining that the phase buck circuit is faulty; otherwise, determining that the phase buck circuit is not faulty.

It should be noted that the first voltage threshold may be greater than the half of the voltage of the power supply and less than the voltage of the power supply, that is, the first voltage threshold may be greater than Vin/2 and less than Vin. The second voltage threshold may be less than the half of the voltage of the power supply and greater than zero, that is, the second voltage threshold is less than Vin/2 and greater than 0.

In this embodiment of this application, in a possible case, because a voltage of the multi-phase buck converter circuit is unstable or a voltage measured by a detection controller at the fault detection point is inaccurate, voltages at the fault detection point at first detection moments in a small quantity of periods are higher than the first voltage threshold, and voltages at second detection moments are lower than the second voltage threshold; or the voltages at the fault detection point at the first detection moments in the small quantity of periods are lower than the second voltage threshold, and the voltages at the second detection moments are higher than the first voltage threshold. Therefore, if the voltage at the first detection moment in the current detection period is higher than the first voltage threshold, and the voltage at the second detection moment in the current detection period is lower than the second voltage threshold; or the voltage at the first detection moment in the current detection period is lower than the second voltage threshold, and the voltage at the second detection moment in the current detection period is higher than the first voltage threshold, it is determined that a result that the phase buck circuit is faulty is relatively inaccurate. Therefore, the voltages in the M historical detection periods may be obtained, where the M historical detection periods and the current detection period are consecutive, and whether the phase buck circuit is faulty is determined based on the voltages at the first detection moment and the second detection moment in the M historical detection periods, so that fault detection for the phase buck circuit can be more accurate.

In some embodiments, the detection period includes a first detection moment and a second detection moment, the first detection moment is a time period in which the first MOS transistor in the-phase buck circuit is on, and the second detection moment is a time period in which the second MOS transistor in the phase buck circuit is on. The determining, based on the voltage in the current detection period, whether the phase buck circuit is currently faulty includes: if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtaining voltages in M historical detection periods, where the M historical detection periods and the current detection period are consecutive, M is a positive integer, the first voltage threshold is greater than a half of a voltage of the power supply and less than the voltage of the power supply, and the second voltage threshold is less than the half of the voltage of the power supply and greater than zero; determining a voltage difference between the voltage at the first detection moment and the voltage at the second detection moment in the current detection period, and determining a voltage difference between the voltage at the first detection moment and the voltage at the second detection moment in each historical detection period, to obtain M+1 voltage differences; and if the M+1 voltage differences are all greater than a third voltage threshold, determining that the phase buck circuit is faulty; otherwise, determining that the phase buck circuit is not faulty, where the third voltage threshold is less than the voltage of the power supply and greater than zero.

It should be noted that the third voltage threshold may be less than the voltage of the power supply and greater than zero, and the third voltage threshold may be preset based on a use requirement. This is not limited in this embodiment of this application. For example, the third voltage threshold may be 1 V or 2 V. In addition, because the voltages at the first detection moment may be higher than the voltages at the second detection moment in the current detection period and in each historical detection period, or the voltages at the first detection moment may be less than the voltages at the second detection moment in the current detection period and in each historical detection period, the M+1 voltage differences may be an absolute value of the voltage difference between the voltage at the first detection moment and the voltage at the second detection moment in the current detection period, or an absolute value of the voltage difference between the voltage at the first detection moment and the voltage at the second detection moment in each historical detection period.

In this embodiment of this application, when the phase buck circuit is not faulty, a voltage at the first detection moment and a voltage at the second detection moment of the phase buck circuit in one detection period may be equal, or a voltage difference between the two voltages is less than the third voltage threshold due to an error or the like. Therefore, when all the M+1 voltage differences are greater than the third voltage threshold, it may be determined that the phase buck circuit is faulty, so that fault detection for the phase buck circuit is more efficient and more stable.

In some embodiments, the detection period includes a first detection moment and a second detection moment, the first detection moment is a time period in which the first MOS transistor in the phase buck circuit is on, and the second detection moment is a time period in which the second MOS transistor in the phase buck circuit is on. The determining, based on the voltage in the current detection period, whether the phase buck circuit is currently faulty includes: if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtaining voltages in detection periods that are in a time window, the time window indicating a time period that starts from the current detection period and that is earlier than a reference duration of the current detection period; and if a voltage at the first detection moment in each detection period in the time window is higher than the first voltage threshold and the voltage at the second detection moment in each detection period in the time window is lower than the second voltage threshold, or the voltage at the first detection moment in each detection period in the time window is lower than the second voltage threshold and a voltage at the second detection moment in each detection period in the time window is higher than the first voltage threshold, determining that the phase buck circuit is faulty; otherwise, determining that the phase buck circuit is not faulty, where the first voltage threshold is greater than a half of a voltage of the power supply and less than the voltage of the power supply, and the second voltage threshold is less than the half of the voltage of the power supply and greater than zero.

It should be noted that the time window is used to indicate the time period that starts from the current detection period and that is earlier than the reference duration of the current detection period. The time window may include a plurality of consecutive historical detection periods that start from the current detection period and that are earlier than the current detection period, and the time window may move as the current detection period proceeds. For example, a time window of a next detection period of the current detection period is used to indicate a time period that starts from the next detection period of the current detection period and that is earlier than reference duration of the next detection period of the current detection period.

In this embodiment of this application, because the time window may include the plurality of consecutive historical detection periods that start from the current detection period and that are earlier than the current detection period, and the time window may move as the current detection period proceeds, the voltage at the first detection moment and the voltage at the second detection moment in each detection period in the time window are detected, so that fault detection for the phase buck circuit is more efficient and more stable.

Optionally, each detection period includes a first detection moment and a second detection moment, the first detection moment is a time period in which the first MOS transistor in the phase buck circuit is on, and the second detection moment is a time period in which the second MOS transistor in the phase buck circuit is on. The determining, based on the voltage in the current detection period, whether the phase buck circuit is faulty includes: if a voltage at the first detection moment in the current detection period is higher than a first voltage threshold and a voltage at the second detection moment in the current detection period is lower than a second voltage threshold, or a voltage at the first detection moment in the current detection period is lower than the second voltage threshold and a voltage at the second detection moment in the current detection period is higher than the first voltage threshold, obtaining voltages in detection periods that are in a time window, the time window indicating a time period that starts from the current detection period and is earlier than a reference duration of the current detection period, the first voltage threshold is greater than a half of a voltage of the power supply and less than the voltage of the power supply, and the second voltage threshold is less than the half of the voltage of the power supply and greater than zero; determining a voltage difference between the voltage at the first detection moment and the voltage at the second detection moment in each detection period in the time window to obtain a plurality of voltage differences; and if the plurality of voltage differences are all greater than a third voltage threshold, determining that the phase buck circuit is faulty; otherwise, determining that the phase buck circuit is not faulty, where the third voltage threshold is less than the voltage of the power supply and greater than zero.

In this embodiment of this application, when the phase buck circuit is not faulty, a voltage at the first detection moment and a voltage at the second detection moment of the phase buck circuit in one detection period may be equal, or a voltage difference between the two voltages is less than the third voltage threshold due to an error or the like. Therefore, when the plurality of voltage differences between the voltage at the first detection moment and the voltage at the second detection moment in the detection periods in the time window are greater than the third voltage threshold, it may be determined that the phase buck circuit is faulty, so that fault detection for the phase buck circuit is more efficient and more stable.

According to a third aspect, a fault detection apparatus of a multi-phase buck converter circuit is provided. The fault detection apparatus of the multi-phase buck converter circuit has a function of implementing the fault detection method of the multi-phase buck converter circuit in the second aspect, and is configured to perform fault detection on the multi-phase buck converter circuit in the first aspect. The fault detection apparatus of the multi-phase buck converter circuit includes a detection module configured to detect a voltage at a fault detection point of a phase buck circuit in a detection period, a determining module configured to determine, based on the voltage in the current detection period, whether the phase buck circuit is faulty, and a sending module configured to, if the phase buck circuit is faulty, send a disable driving signal to the drive circuit indicating the drive circuit stop driving the phase buck circuit.

According to a fourth aspect, a fault detection apparatus of a multi-phase buck converter circuit is provided. The fault detection apparatus of the multi-phase buck converter circuit includes a processor and a memory. The memory is configured to store a program supporting the fault detection apparatus of the multi-phase buck converter circuit to perform the fault detection method of the multi-phase buck converter circuit in the second aspect, and store related data used by the apparatus to implement the fault detection method of the multi-phase buck converter circuit in the second aspect. The processor is configured to execute the program stored in the memory. The fault detection apparatus of the multi-phase buck converter circuit may further include a communications bus, where the communications bus is configured to establish a connection between the processor and the memory.

According to a fifth aspect, this application further provides a computer-readable storage medium. The computer-readable storage medium stores instructions, and when the instructions are run on a computer, the computer is enabled to perform the fault detection method of the multi-phase buck converter circuit in the second aspect.

According to a sixth aspect, a network device is provided. The network device includes the multi-phase buck converter circuit in the first aspect.

According to a seventh aspect, a computer program product including instructions is provided. When the computer program product is run on a computer, the computer is enabled to perform the fault detection method of the multi-phase buck converter circuit in the second aspect.

Technical effects obtained in the third aspect, the fourth aspect, the fifth aspect, the sixth aspect, and the seventh aspect are similar to technical effects obtained by using corresponding technical means in the second aspect. Details are not described herein again.

The technical solutions provided in this application can bring at least the following beneficial effects:

In the embodiments of this application, the multi-phase buck converter circuit includes the power supply, the N phase buck circuits, the N inductors, the first capacitor, the load, the detection controller, and the drive circuit, where N is a positive integer greater than or equal to 2. The input terminal of the detection controller is connected to the fault detection point of each phase buck circuit in the N phase buck circuits. Because the fault detection point of each phase buck circuit corresponds to different voltages at different time points, the detection controller may detect, based on the voltage at the fault detection point of each phase buck circuit in the N phase buck circuits, whether each phase buck circuit is faulty. In other words, the detection controller may synchronously detect the voltage at the fault detection point of each phase buck circuit, to synchronously detect whether each phase buck circuit is faulty. When the detection controller determines that the any one of the N phase buck circuits is faulty, the drive circuit may stop driving the phase buck circuit. This implements isolation of the phase buck circuit, and avoids a case in which the load cannot work normally because the phase buck circuit is faulty. In other words, in the multi-phase buck converter circuit provided in the embodiments of this application, a fault of the any one of the phase buck circuits does not affect normal working of the multi-phase buck converter circuit.

BRIEF DESCRIPTION OF DRAWINGS

FIG. 7 is a diagram 700 of a status of each MOS transistor in a phase buck circuit according to an embodiment of the application;

FIG. 8 is a diagram 800 of a voltage at a fault detection point in a first phase buck circuit according to an embodiment of the application;

DESCRIPTION OF EMBODIMENTS

To make objectives, technical solutions, and advantages of this application clearer, the following further describes embodiments of this application in detail with reference to the accompanying drawings.

Before the embodiments of this application are described in detail, an implementation scenario of the embodiments of this application is first described.

A multi-phase buck converter circuit as provided in the embodiments of this application may be applied to a network device, a communications device, a wireless device, or the like. The network device may be a router, a server, a LAN switch, or the like, for example. The embodiments of this application are not limited to the above examples. The multi-phase buck converter circuit provided in the embodiments of this application may provide electric energy for a processor in a router or other device. In an operating multi-phase buck converter circuit, whether a phase buck circuit included in the multi-phase buck circuits is faulty can be detected in real time and synchronously. The synchronization means that a faulty phase buck circuit can be detected by determining that the phase buck circuit is not generating an output voltage during a time period when the phase buck circuit should be generating an output voltage. When a phase buck circuit is faulty, the driving of the phase buck circuit may be stopped. This isolates the phase buck circuit and avoids a case in which the processor in the associated device (powered by the multi-phase buck converter circuit) cannot operate normally because the phase buck circuit is faulty.

Figure 1:
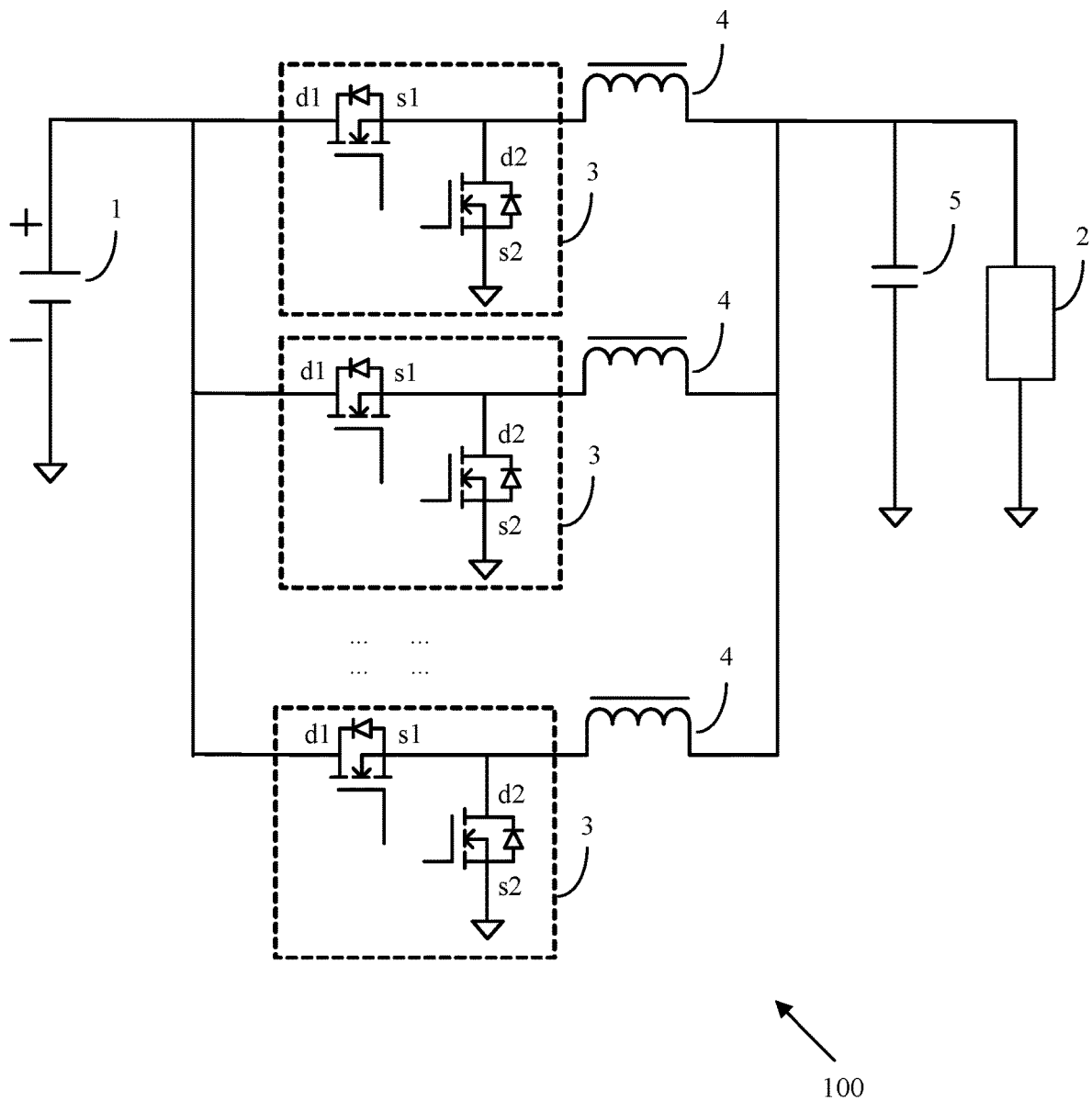
FIG. 1 is a diagram of a conventional multi-phase buck converter circuit 100.
Figure 2:
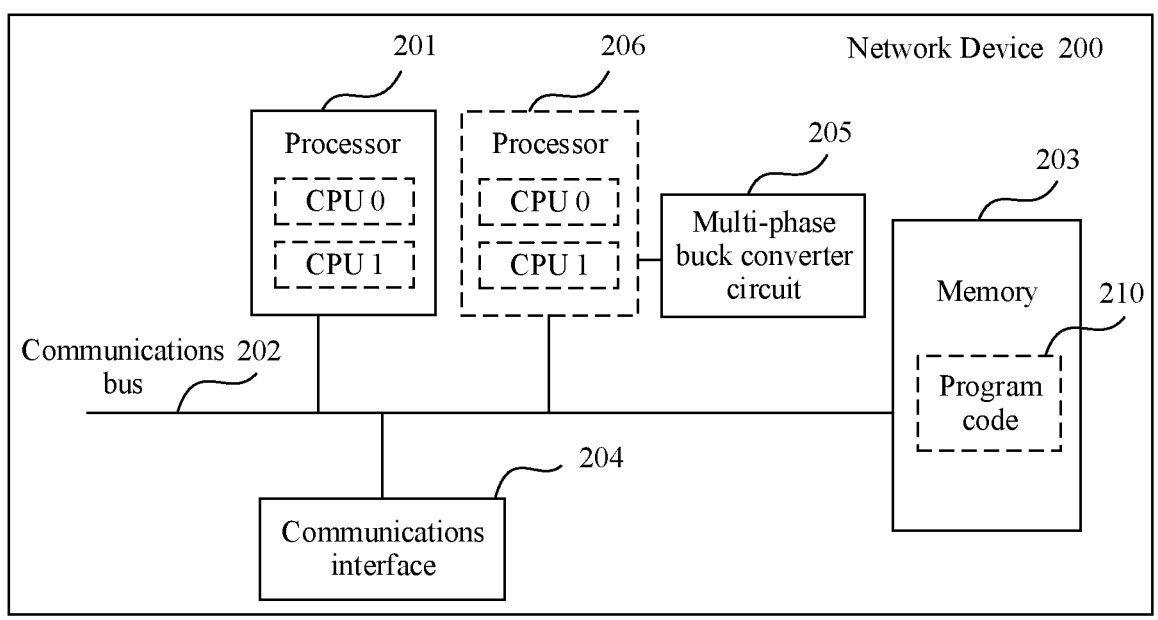
FIG. 2 is a diagram of a network device 200 according to an embodiment of the application.

FIG. 2 is a diagram of a network device 200 according to an embodiment of the application. The network device 200 includes at least one processor 201, a communications bus 202, a memory 203, at least one communications interface 204, and a multi-phase buck converter 205. The multi-phase buck converter circuit 205 includes multiple (i.e., N number) of the individual phase buck circuits 3 (see FIGS. 3-5). It should be understood that the multi-phase buck converter circuit 205 can include any number of phase buck circuits 3.

The processor 201 may be a general-purpose CPU, a microprocessor, an application-specific integrated circuit (application-specific integrated circuit, ASIC), or the like.

The communications bus 202 may include a path used to transmit information between the foregoing components.

The memory 203 may be a read-only memory (read-only memory, ROM) or another type of static storage device that can store static information and/or instructions, or a random access memory (random access memory, RAM) or another type of dynamic storage device that can store information and/or instructions. Alternatively, the memory 203 may be an electrically erasable programmable read-only memory (Electrically Erasable Programmable Read-Only Memory, EEPROM), a compact disc read-only memory (Compact Disc Read-Only Memory, CD-ROM) or another compact disc storage, an optical disc storage (including a compact optical disc, a laser disc, an optical disc, a digital versatile disc, a Blu-ray disc, and the like), a magnetic disk storage medium or another magnetic storage device, or any other medium that can be configured to carry or store expected program code in a form of an instruction or a data structure and that can be accessed by the network device. However, the memory 203 is not limited thereto. The memory 203 may exist independently, and be connected to the processor 201 through the communications bus 202. Alternatively, the memory 203 may be integrated with the processor 201.

The communications interface 204 is configured to communicate, by using any apparatus such as a transceiver, with another device or a communications network such as the Ethernet, a radio access network (Radio Access Network, RAN), or a wireless local area network (Wireless Local Area Networks, WLAN).

In an embodiment, the network device may include a plurality of processors, for example, the processor 201 and a processor 206 shown in FIG. 2. Each of the processors may be a single-core processor (single-CPU) or may be a multi-core processor (multi-CPU). The processors 201 and/or 206 may each include one or more CPUs, for example a CPU 0 and a CPU 1, as shown in FIG. 2. The processor may be one or more devices, circuits, and/or processing cores configured to process data.

In an embodiment, the network device may further include an output device 207 and an input device 208 (not shown in the figure). The output device 207 communicates with the processor 201 and may display information in a plurality of manners. For example, the output device 207 may be a liquid crystal display (liquid crystal display, LCD), a light emitting diode (light emitting diode, LED) display device, a cathode ray tube (cathode ray tube, CRT) display device, or a projector (projector). The input device 208 communicates with the processor 201 and may receive an input or inputs from a user in a plurality of manners. For example, the input device 208 may be a mouse, a keyboard, a touchscreen device, a sensor, or the like.

The network device may be a general-purpose network device or a dedicated network device. In implementation, the network device may be a router, a LAN switch, a server, or the like. A type of the network device is not limited in the embodiments of this application. For example, the multi-phase buck converter circuit 205 may provide electric energy for the processor 206. In operation of the multi-phase buck converter circuit 205, the multi-phase buck converter circuit 205 can detect whether the N phase buck circuits included in the multi-phase buck converter circuit 205 are faulty can be detected in real time and synchronously. When a phase buck circuit is faulty, driving of that phase buck circuit may be stopped. It should be understood that more than one phase buck circuit can be suspended, as needed. This implements isolation of a faulty phase buck circuit, and avoids a case in which the processor 206 cannot work normally because an individual phase buck circuit (or circuits) within the multi-phase buck converter circuit 205 is faulty.

Figure 3:
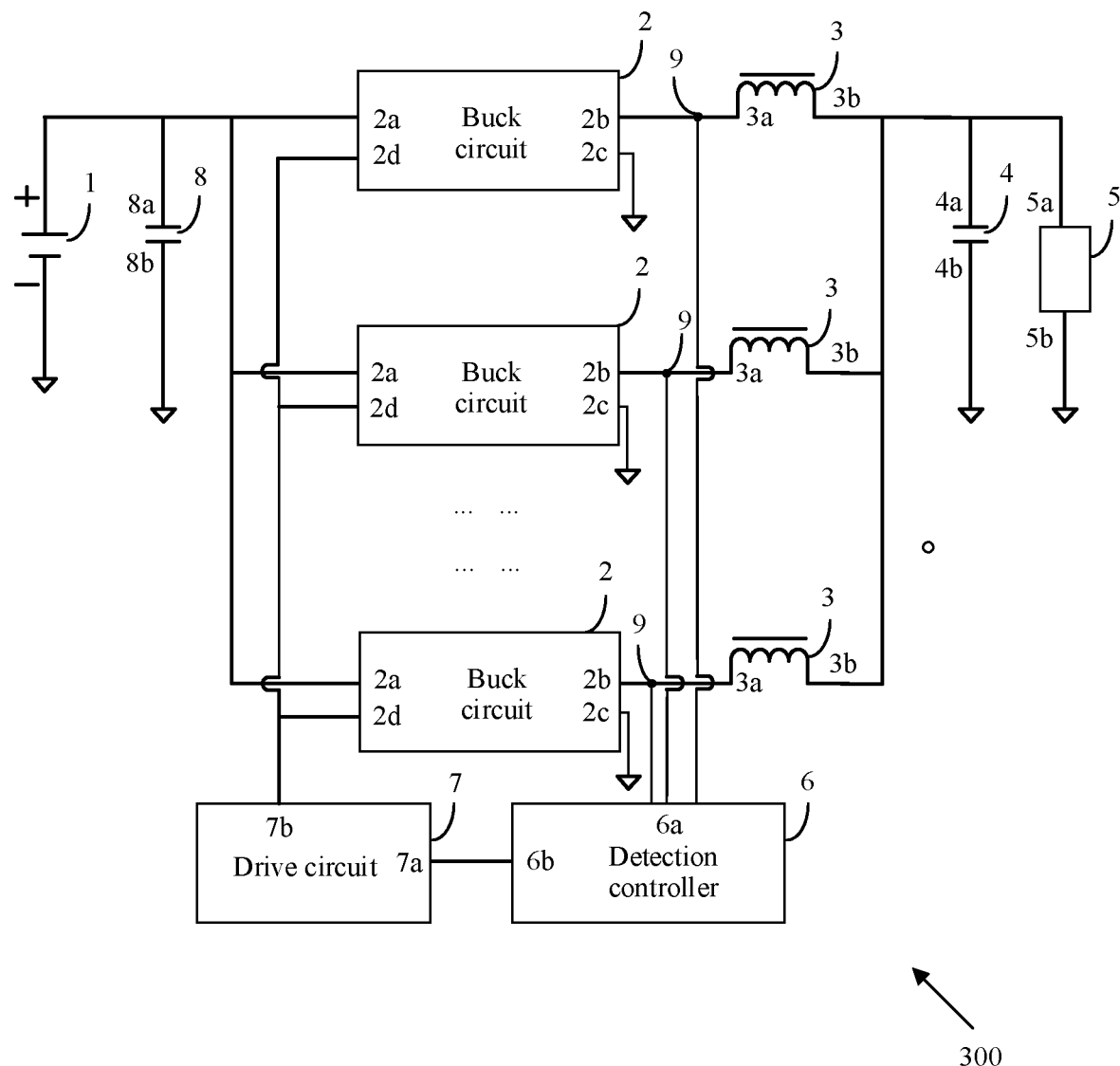
FIG. 3 is a diagram of a first multi-phase buck converter circuit 300 according to an embodiment of the application.

FIG. 3 is a diagram of a multi-phase buck converter circuit 300 according to an embodiment of the application. The multi-phase buck converter circuit 300 includes a power supply 1, N phase buck circuits 2, N inductors 3, a first capacitor 4, a load 5, a detection controller 6, and a drive circuit 7, where the N phase buck circuits 2 are in one-to-one correspondence with the N inductors 3, and N is a positive integer greater than or equal to 2. A positive electrode of the power supply 1 is connected to a first input terminal 2a of the phase buck circuit 2, a first output terminal 2b of the phase buck circuit 2 is connected to a first terminal 3a of a corresponding inductor 3 in the N inductors 3, a second terminal 3b of the N inductor 3 is connected to a first terminal 4a of the first capacitor 4, a second output terminal 2c of the phase buck circuit 2 and a second terminal 4b of the first capacitor 4 are connected to a negative electrode of the power supply 1, and the load 5 is connected in parallel to the two terminals of the first capacitor 4. An input terminal 6a of the detection controller 6 is connected to a fault detection point 9 (or fault detection node 9) of each phase buck circuit 2 in the phase buck circuits 2 (i.e., is connected to an output terminal 2b of each phase buck circuit 2), an output terminal 6b of the detection controller 6 is connected to an input terminal 7a of the drive circuit 7, and an output terminal 7b of the drive circuit 7 is connected to a second input terminal 2d of the phase buck circuit 2.

It should be noted that the power supply 1 may provide electric energy for the load 5 by using the phase buck circuits 2, where the power supply 1 may be a direct current power supply or the like. The phase buck circuits 2 may alternately be on and off based on a specific time sequence, to continuously supply power to the load 5. In addition, a voltage ripple input by the power supply 1 to the load 5 may be reduced in a manner in which the phase buck circuits 2 are alternately on and off. The time sequence may be preset based on a use requirement. This is not limited in this embodiment of this application. Different phase buck circuits 2 in the phase buck circuits 2 may correspond to different phases, and two adjacent phase buck circuits 2 may have a same phase difference. The phase difference may be obtained by dividing 360 degrees by N. In this case, a use frequency of each phase buck circuit 2 is 1/N. For example, when N is equal to 4, a phase difference between two adjacent phase buck circuits 2 in the 4-phase buck circuits 2 is 360 degrees divided by 4, that is, 90 degrees. Therefore, phases of the 4-phase buck circuits 2 may be 90 degrees, 180 degrees, 270 degrees, and 360 degrees. In this case, a use frequency of each phase buck circuit 2 in the 4-phase buck circuits 2 is ¼.

In addition, the multi-phase buck converter circuit 300 may be a three-level circuit. In a possible implementation, the multi-phase buck converter circuit 300 may alternatively be a five-level circuit. This is not limited in this embodiment of this application. In addition, when preventing a current from passing through, the inductor 3 may temporarily store electric energy in a form of a magnetic field. When the current in the circuit reduces, the inductor 3 may release the temporarily stored energy. The first capacitor 4 and a second capacitor 8 may filter an input current of the load 5, to reduce noise of the input current of the load 5 and improve smoothness of the input current of the load 5. Types, models, and the like of the inductor 3, the first capacitor 4, and the second capacitor 8 may be preset based on a use requirement. The load 5 may be a chip or the like. This is not limited in this embodiment of this application.

It should be noted that, in the implementation shown in FIG. 3, the second output terminal 2c of the phase buck circuit 2, the second terminal 4b of the first capacitor 4, a second terminal 8b of the second capacitor 8, and the negative electrode of the power supply 1 may all be grounded. In this case, both the second output terminal 2b of the N phase buck circuit 2 and the second terminal 4b of the first capacitor 4 may be connected to the negative electrode of the power supply 1. In addition, a first terminal 5a of the load 5 may be connected to the first terminal 4a of the first capacitor 4, and a second terminal 5b of the load 5 may be grounded. In this case, the load 5 may be connected in parallel with the first capacitor 4. In addition, the first terminal 8a of the second capacitor 8 may be connected to the positive electrode of the power supply, and the second terminal 8b of the second capacitor 8 may be grounded. In this case, the second capacitor 8 may be connected in parallel between the positive electrode and the negative electrode of the power supply 1.

In addition, the fault detection point 9 may be located between the first output terminal 2b of each phase buck circuit 2 and the first terminal 3a of the corresponding inductor 3. The fault detection point 9 of each phase buck circuit 2 may correspond to (and exhibit) different voltages at different time points of a drive cycle. This is described in detail below. The detection controller 6 may detect, based on the voltage at the fault detection point 9 of each phase buck circuit 2 in the N phase buck circuits 2, whether each phase buck circuit 2 is faulty. For example, the detection controller may synchronously detect the voltage at the fault detection point 9 of each phase buck circuit 2, to synchronously detect whether each phase buck circuit 2 is faulty. In addition, the drive circuit 7 is configured to: drive the phase buck circuits 2 to work alternately. When the detection controller 6 determines that a particular phase buck circuit 2 in the N phase buck circuits is faulty, the driving of the particular phase buck circuit 2 is stopped.

Figure 4:
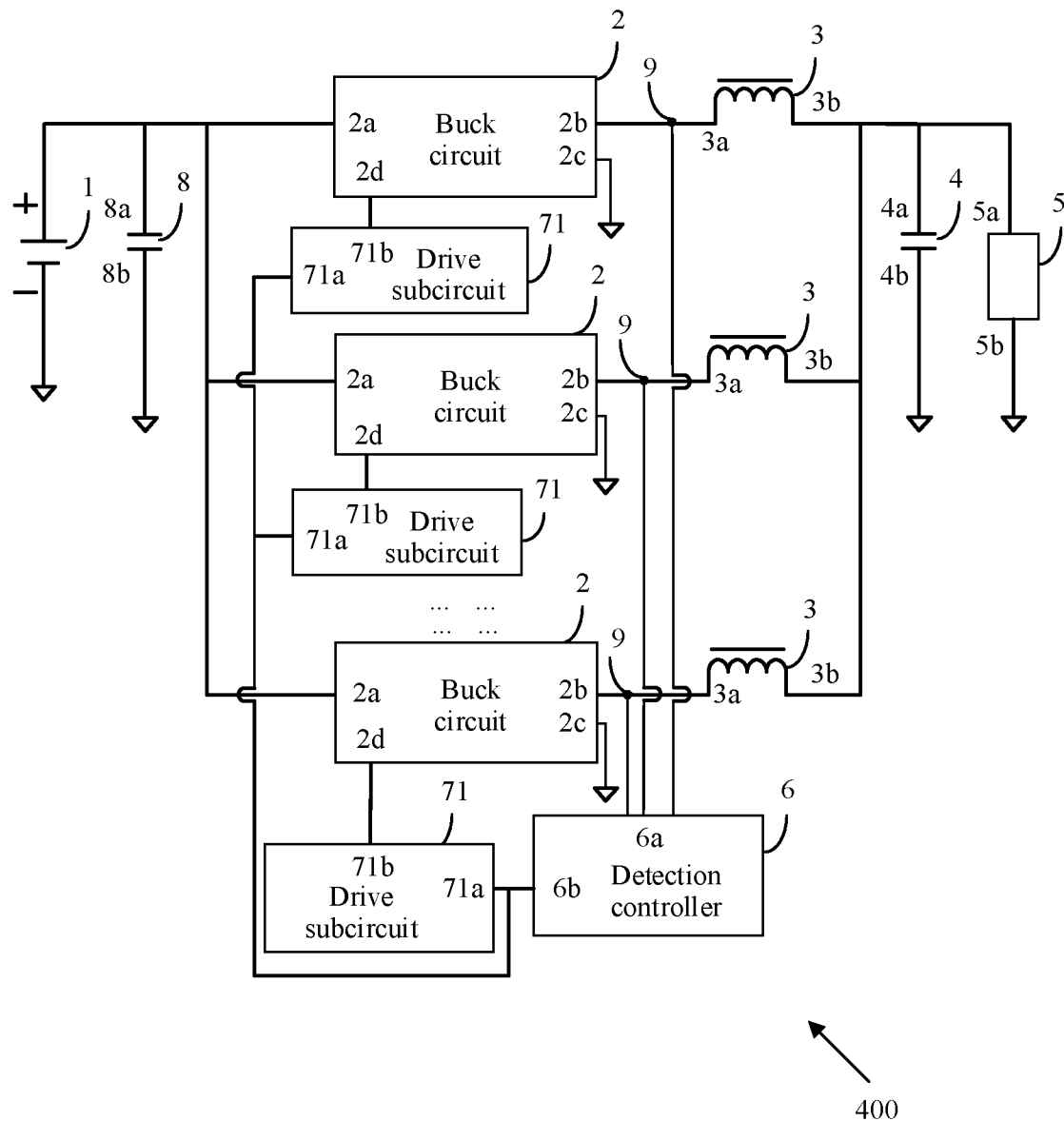
FIG. 4 is a diagram of a second multi-phase buck converter circuit 400 according to an embodiment of the application.

FIG. 4 is a diagram of a multi-phase buck converter circuit 400 according to an embodiment of the application. The drive circuit 7 may include N drive subcircuits 71, and the N drive subcircuits 71 are in one-to-one correspondence with the N phase buck circuits 2. Input terminals 71a of the N drive subcircuits 71 are respectively connected to the output terminal 6b of the detection controller 6, and output terminals 71b of the N drive subcircuits 71 are respectively connected to the second input terminal 2d of the phase buck circuit 2. The N drive subcircuits 71 are configured to drive the phase buck circuits 2 to work alternately.

Figure 5:
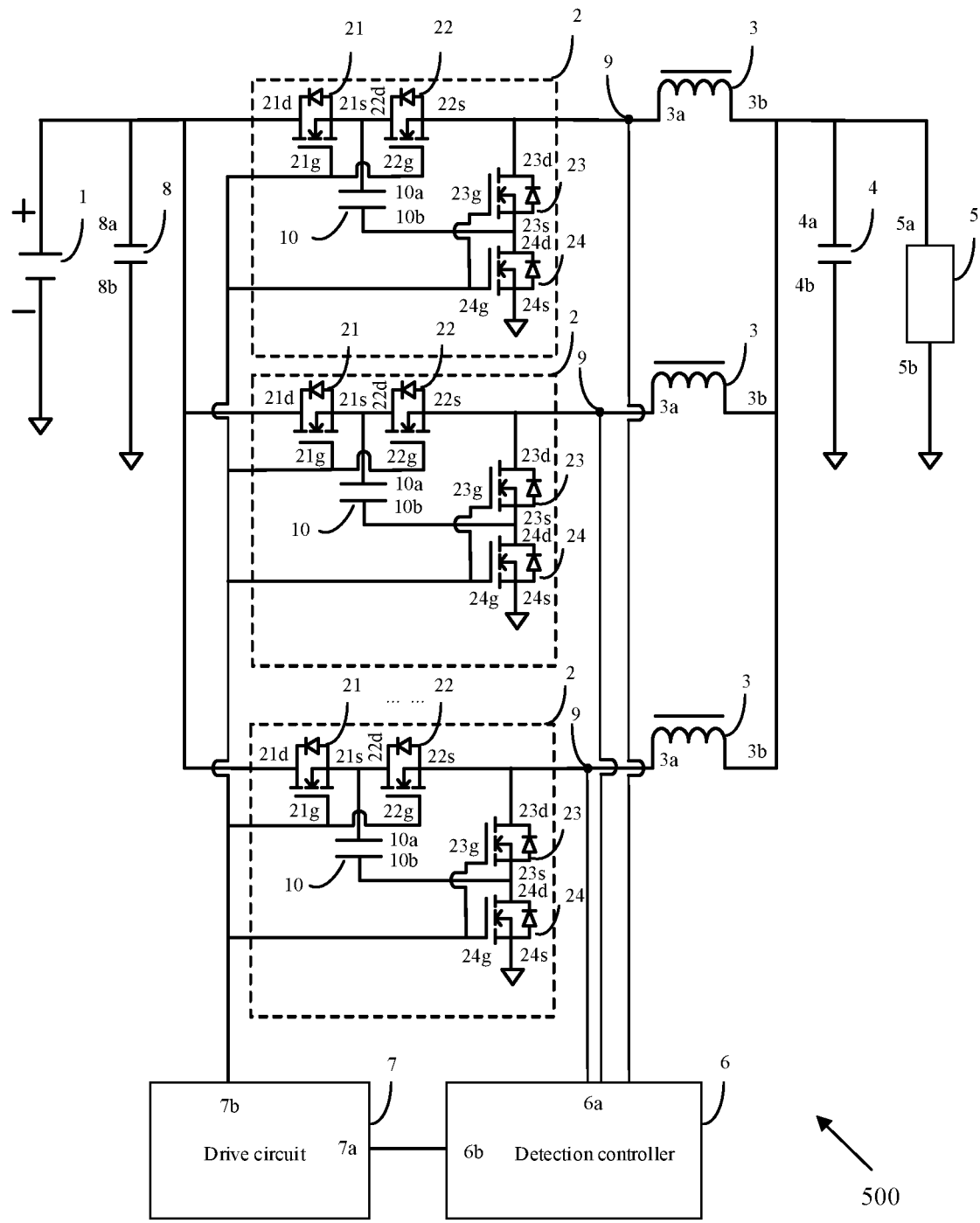
FIG. 5 is a diagram of a third multi-phase buck converter circuit 500 according to an embodiment of the application.

FIG. 5 is a diagram of a multi-phase buck converter circuit 500 according to an embodiment of the application. For the phase buck circuit 2 in the N phase buck circuits 2, the phase buck circuit 2 may include a first MOS transistor 21, a second MOS transistor 22, a third MOS transistor 23, a fourth MOS transistor 24, and a third capacitor 10. A drain 21d of the first MOS transistor 21 is connected to the positive electrode of the power supply 1, a source 21s of the first MOS transistor 21 is respectively connected to a drain 22d of the second MOS transistor 22 and to a first terminal 10a of the third capacitor 10, a source 22s of the second MOS transistor 22 is respectively connected to a drain 23d of the third MOS transistor 23 and to a first terminal 3a of an inductor 3 corresponding to the phase buck circuit 2, a source 23s of the third MOS transistor 23 is respectively connected to a drain 24d of the fourth MOS transistor 24 and to a second terminal 10b of the third capacitor 10, a source 24s of the fourth MOS transistor 24 is connected to the negative electrode (i.e., ground) of the power supply 1, and a connection point between the source 22s of the second MOS transistor 22 and the drain 23d of the third MOS transistor 23 is used as the fault detection point 9 of the phase buck circuit 2. The output terminal 7b of the drive circuit 7 is connected to a gate 21g of the first MOS transistor 21, a gate 22g of the second MOS transistor 22, a gate 23g of the third MOS transistor 23, and a gate 24g of the fourth MOS transistor 24.

It should be noted that the first MOS transistor 21, the second MOS transistor 22, the third MOS transistor 23, and the fourth MOS transistor 24 are all metal-oxide-semiconductor field-effect transistors. A function of any one of the four MOS transistors in the buck circuit 2 may be equivalent to that of a switch. In other words, that any one of the MOS transistors is on is equivalent to that a switch is on, and that any one of the MOS transistors is off is equivalent to that a switch is off. The first MOS transistor 21, the second MOS transistor 22, the third MOS transistor 23, and the fourth MOS transistor 24 may all be N-type MOS transistors, P-type MOS transistors, or the like. In addition, a body diode may be disposed on each MOS transistor. A function of the body diode may be that when a phase buck circuit 2 in which the MOS transistor is located has a reverse induced voltage, the reverse induced voltage passes through the body diode to prevent the reverse induced voltage from breaking down the MOS transistor. In addition, the drive circuit 7 may be configured to drive the first MOS transistor 21, the second MOS transistor 22, the third MOS transistor 23, and the fourth MOS transistor 24 of the phase buck circuits 2 to be on or off, and to drive each phase buck circuit 2 of the N phase buck circuits 2 to work alternately (i.e., in some embodiments each phase buck circuit 2 will be turned on for a different and unique time portion of a drive cycle, and may be turned on more than once in the drive cycle). Because the output terminal of the drive circuit 7 is connected to the gate 21g of the first MOS transistor 21, the gate 22g of the second MOS transistor 22, the gate 23g of the third MOS transistor 23, and the gate 24g of the fourth MOS transistor 24 (of a particular phase buck circuit 2), when a voltage applied to the gate of any one of the four MOS transistors by the drive circuit 7 is greater than a breakover voltage of the MOS transistor, a conductive channel is formed between the source and the drain of the MOS transistor, electrons may flow from the source to the drain of the MOS transistor through the conductive channel for that particular phase buck circuit 2. In other words, a current may flow from the drain to the source of the MOS transistor. In this case, the MOS transistor is on. When the voltage applied to the gate of any one of the four MOS transistors by the drive circuit 7 is less than the breakover voltage of the MOS transistor, the conductive channel is not formed between the source and the drain of the MOS transistor. In other words, the current does not flow from the drain to the source of the MOS transistor. In this case, the MOS transistor is off. Consequently, the drive circuit 7 may control the voltage applied to the gate 21g of the first MOS transistor 21, the gate 22g of the second MOS transistor 22, the gate 23g of the third MOS transistor 23, and the gate 24g of the fourth MOS transistor 24, to drive the first MOS transistor 21, the second MOS transistor 22, the third MOS transistor 23, and the fourth MOS transistor 24 to be on or off. In addition, the third capacitor 10 is configured to: when the drive circuit 7 drives the first MOS transistor 21, the second MOS transistor 22, the third MOS transistor 23, and the fourth MOS transistor 24 to be on or off, provide a path in which the transistor may alternately be on. The third capacitor 10 may be a flying capacitor or the like, and the third capacitor 10 may be denoted as Cfn or the like. This is not limited in this embodiment of this application.

In addition, during actual application, the first MOS transistor 21 and the second MOS transistor 22 may be connected in series to serve as a dual-upper MOS transistor in the phase buck circuits, and the third MOS transistor 23 and the fourth MOS transistor 24 are connected in series to serve as a dual-lower MOS transistor in the phase buck circuits. The dual-upper MOS transistor and the dual-lower MOS transistor may be integrated in a network device, for example, a router or a server.

The following describes, using a phase buck circuit 2 as an example, that the phase buck circuit 2 generates different output voltages at different time points (at the fault detection point 9). The phase buck circuit 2 is any phase buck circuit 2 in the N phase buck circuits 2.

Figure 6:
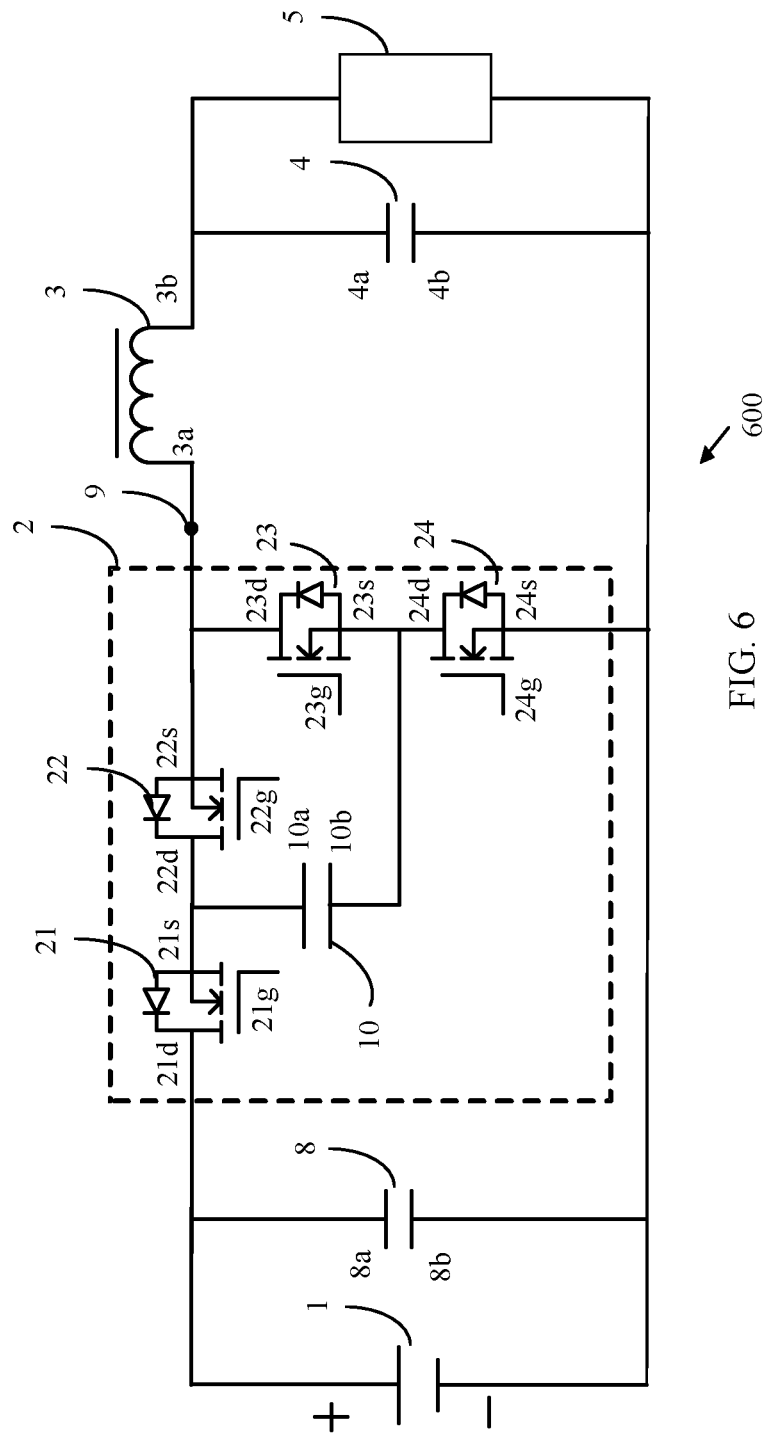
FIG. 6 is a diagram 600 of an equivalent circuit of a phase buck circuit according to an embodiment of the application.

FIG. 6 is a diagram of an equivalent circuit 600 of a particular phase buck circuit 2 according to an embodiment.

FIG. 7 is a diagram 700 of a status of each MOS transistor in a particular phase buck circuit according to an embodiment of the application. The figure therefore is a diagram of a status of each of the first MOS transistor 21 (A), the second MOS transistor 22 (B), the third MOS transistor 23 (C), and the fourth MOS transistor 24 (D) in the particular phase buck circuit 2 in different time portions of one detection period. In the figure, A represents a conduction status of the first MOS transistor 21 in the detection period, B represents a conduction status of the second MOS transistor 22 in the detection period, C represents a conduction status of the third MOS transistor 23 in the detection period, and D represents a conduction status of the fourth MOS transistor 24 in the detection period. Table 1 (below) shows a status of each MOS transistor in the particular phase buck circuit 2 in different time periods in the detection period and shows an output voltage at a corresponding fault detection point 9. For ease of description, a voltage of the power supply 1 is denoted as Vin, and the resistance of the first MOS transistor 21, the second MOS transistor 22, the third MOS transistor 23, and the fourth MOS transistor 24 is denoted as 0 (i.e., essentially a zero resistance or impedance value). When any one of the four MOS transistors is on, that MOS transistor ideally does not consume a voltage in the circuit. In addition, for ease of description, a fault detection point 9 described below is the fault detection point 9 of the particular phase buck circuit 2, and a voltage at the fault detection point 9 is the voltage at the fault detection point 9 of the particular phase buck circuit 2.

In a time period from t0 to t1 in the detection period, the first MOS transistor 21 and the third MOS transistor 23 are on, and the second MOS transistor 22 and the fourth MOS transistor 24 are off. In this case, the power supply 1, the first MOS transistor 21, the third capacitor 10, the third MOS transistor 23, the inductor 3, and the load 5 form a loop (or circuit). The load 5 is connected in parallel to the first capacitor 4. In this case, the power supply 1 may charge the third capacitor 10 and the first capacitor 4. A voltage at the first terminal 10a of the third capacitor 10 is Vin, a voltage at the second terminal 10b of the third capacitor 10 is Vin/2, a voltage at the first terminal 4a of the first capacitor 4 is Vin/2, and a voltage at the second terminal 4b of the first capacitor 4 is 0. To be specific, the third capacitor 10 and the first capacitor 4 each share a half of the voltage of the power supply 1, that is, Vin/2. In this case, the voltage at the fault detection point 9 may be equivalent to the voltage at the second terminal 10b of the third capacitor 10, that is, Vin/2. The time period from t0 to t1 may also be referred to as a rectification time period.

In a time period from t1 to t2 in the detection period, the third MOS transistor 23 is on, and the first MOS transistor 21, the second MOS transistor 22, and the fourth MOS transistor 24 are off. In this case, the equivalent phase buck circuit 2 shown in FIG. 6 is disconnected. Therefore, the voltage at the fault detection point 9 is zero. The time period from t1 to t2 may also be referred to as a dead time period.

In a time period from t2 to t3 in the detection period, the third MOS transistor 23 and the fourth MOS transistor 24 are on, and the first MOS transistor 21 and the second MOS transistor 22 are off. In this case, the third MOS transistor 23, the inductor 3, the first capacitor 4, the load 5, and the fourth MOS transistor 24 form a loop (or circuit). Because the power supply 1 charges the first capacitor 4 in the time period from t0 to t1, the voltage at the first terminal 4a of the first capacitor 4 is Vin/2, and the voltage at the second terminal 4b of the first capacitor 4 is zero. In this case, the voltage at the fault detection point 9 may be equivalent to the voltage at the second terminal 4b of the first capacitor 4, that is, 0. The time period from t2 to t3 may also be referred to as a freewheeling time period.

In a time period from t3 to t4 in the detection period, the fourth MOS transistor 24 is on, and the first MOS transistor 21, the second MOS transistor 22, and the third MOS transistor 23 are off. In this case, the equivalent circuit shown in FIG. 6 is disconnected. Therefore, the voltage at the fault detection point 9 is zero. The time period from t3 to t4 may also be referred to as a dead time period.

In a time period from t4 to t5 in the detection period, the second MOS transistor 22 and the fourth MOS transistor 24 are on, and the first MOS transistor 21 and the third MOS transistor 23 are off. The third capacitor 10, the second MOS transistor 22, the inductor 3, the first capacitor 4, the load 5, and the fourth MOS transistor 24 form a loop. Because the power supply 1 charges the third capacitor 10 in the time period from t0 to t1, the voltage at the first terminal 10a of the third capacitor 10 is Vin, and the voltage at the second terminal 10b of the third capacitor 10 is Vin/2, that is, a voltage difference between the two terminals of the third capacitor 10 is Vin/2. In the time period from t4 to t5, the third capacitor 10 may release stored electric energy. After releasing the stored energy, the voltage at the first terminal 10a of the third capacitor 10 will be Vin/2, and the voltage at the second terminal 10b of the third capacitor 10 will be zero. The voltage at the fault detection point 9 may be equivalent to the voltage at the first terminal 10a of the third capacitor 10, that is, Vin/2. The time period from t4 to t5 may be referred to as a rectification time period.

In a time period from t5 to t6 in the detection period, the fourth MOS transistor 24 is on, and the first MOS transistor 21, the second MOS transistor 22, and the third MOS transistor 23 are off. In this case, the equivalent circuit shown in FIG. 6 is disconnected. Therefore, the voltage at the fault detection point 9 is 0. The time period from t5 to t6 may be referred to as a dead time period.

In a time period from t6 to t7 in the detection period, the third MOS transistor 23 and the fourth MOS transistor 24 are on, and the first MOS transistor 21 and the second MOS transistor 22 are off. In this case, the third MOS transistor 23, the inductor 3, the first capacitor 4, the load 5, and the fourth MOS transistor 24 form a loop. The voltage at the first terminal 4a of the first capacitor 4 is Vin/2, and the voltage at the second terminal 4b of the first capacitor 4 is zero. In this case, the voltage at the fault detection point 9 may be equivalent to the voltage at the second terminal 4b of the first capacitor 4, that is, zero. The time period from t6 to t7 may also be referred to as a freewheeling time period.

In a time period from t7 to t8 in the detection period, the third MOS transistor 23 is on, and the first MOS transistor 21, the second MOS transistor 22, and the fourth MOS transistor 24 are off. In this case, the equivalent circuit shown in FIG. 6 is disconnected. Therefore, the voltage at the fault detection point 9 is zero. The time period from t7 to t8 may also be referred to as a dead time period.

TABLE 1

| Time period | On | Off | Voltage at a fault detection point 9 |
|---|---|---|---|
| t0 to t1 | First MOS transistor 21 and third MOS transistor 23 | second MOS transistor 22 and fourth MOS transistor 24 | Vin/2 |
| t1 to t2 | Third MOS transistor 23 | First MOS transistor 21, second MOS transistor 22, and fourth MOS transistor 24 | 0 |
| t2 to t3 | Third MOS transistor 23 and fourth MOS transistor 24 | First MOS transistor 21 and second MOS transistor 22 | 0 |
| t3 to t4 | Fourth MOS transistor 24 | First MOS transistor 21, second MOS transistor 22, and third MOS transistor 23 | 0 |
| t4 to t5 | Second MOS transistor 22 and fourth MOS transistor 24 | First MOS transistor 21 and third MOS transistor 23 | Vin/2 |
| t5 to t6 | Fourth MOS transistor 24 | First MOS transistor 21, second MOS transistor 22, and third MOS transistor 23 | 0 |
| t6 to t7 | Third MOS transistor 23 and fourth MOS transistor 24 | First MOS transistor 21 and second MOS transistor 22 | 0 |
| t7 to t8 | Third MOS transistor 23 | First MOS transistor 21, second MOS transistor 22, and fourth MOS transistor 24 | 0 |

FIG. 8 is a diagram 800 of a voltage at a fault detection point in a phase buck circuit 2 according to an embodiment. Based on the voltage at the fault detection point 9 in the detection period shown in Table 1, a diagram of the resulting voltage at the fault detection point 9 in the detection period shown in FIG. 8 may be determined. In the time period from t0 to t1 in which the first MOS transistor 21 and the third MOS transistor 23 are on, and in the time period from t4 to t5 in which the second MOS transistor 22 and the fourth MOS transistor 24 are on, the voltage at the fault detection point 9 is Vin/2. In other time periods in the detection period, the voltages at the fault detection point 9 are zero. In addition, because the first MOS transistor 21 is only on in the time period from t0 to t1 in the detection period, that the first MOS transistor 21 and the third MOS transistor 23 are on may be simply referred to as that the first MOS transistor 21 is on. Because the second MOS transistor 22 is only on in the time period from t4 to t5 in the detection period, that the second MOS transistor 22 and the fourth MOS transistor 24 are on may be simply referred to as that the second MOS transistor 22 is on. It should be understood that the first MOS transistor 21 and the fourth MOS transistor 24 may be considered as two equivalent MOS transistors, and the second MOS transistor 22 and the third MOS transistor 23 may be considered as two equivalent MOS transistors. In other words, when either of the first MOS transistor 21 or the fourth MOS transistor 24 is faulty, there is a same change in the voltage at the fault detection point 9 in the detection period. When either of the second MOS transistor 22 or the third MOS transistor 23 is faulty, there is a same change in the voltage at the fault detection point 9 in the detection period.

In this case, the detection controller 6 detects the voltage at the fault detection point 9 of each phase buck circuit 2, that is, detects the voltage of each phase buck circuit 2 when the first MOS transistor 21 is on, and the voltage of each phase buck circuit 2 when the second MOS transistor 22 is on.

It should be noted that the first MOS transistor 21 and the third MOS transistor 23 are on in the time period from t0 to t1, and the second MOS transistor 22 and the fourth MOS transistor 24 are on in the time period from t4 to t5. Therefore, in the time period from t0 to t1, both a withstand voltage of the first MOS transistor 21 and a withstand voltage of the third MOS transistor 23 are a half of their respective withstand voltages. In the time period from t4 to t5, both a withstand voltage of the second MOS transistor 22 and a withstand voltage of the fourth MOS transistor 24 are a half of their respective withstand voltages. In addition, in the detection period, a ratio of duration of the time period from t0 to t1 in which the first MOS transistor 21 and the third MOS transistor 23 are on to duration of the detection period is relatively large, and duration of the time period from t4 to t5 in which the second MOS transistor 22 and the fourth MOS transistor 24 are on to the duration of the detection period is relatively large. In other words, an effective duty cycle of each phase buck circuit 2 in the multi-phase buck converter circuit is relatively large.

In this embodiment of this application, the multi-phase buck converter circuit includes the power supply 1, the N phase buck circuits 2, the N inductors 3, the first capacitor 4, the load 5, the detection controller 6, and the drive circuit 7, where N is a positive integer greater than or equal to 2. The input terminal of the detection controller 6 is connected to the fault detection point 9 of each phase buck circuit 2 in the N phase buck circuits 2. Because the fault detection point 9 of each phase buck circuit 2 corresponds to different voltages at different time points, the detection controller 6 may detect, based on the voltage at the fault detection point 9 of each phase buck circuit 2 in the N phase buck circuits 2, whether each phase buck circuit 2 is faulty. In other words, the detection controller 6 may synchronously detect the voltage at the fault detection point 9 of each phase buck circuit 2, to synchronously detect whether each phase buck circuit 2 is faulty. When the detection controller 6 determines that the phase buck circuit 2 in the N phase buck circuits 2 is faulty, the drive circuit 7 may stop driving the phase buck circuit 2. This implements isolation of the phase buck circuit 2, and avoids a case in which the entire multi-phase buck converter circuit is faulty because the phase buck circuit 2 is faulty. In other words, in the multi-phase buck converter circuit provided in the embodiments of this application, a fault of the phase buck circuit 2 does not affect normal working of the multi-phase buck converter circuit.

Figure 9:
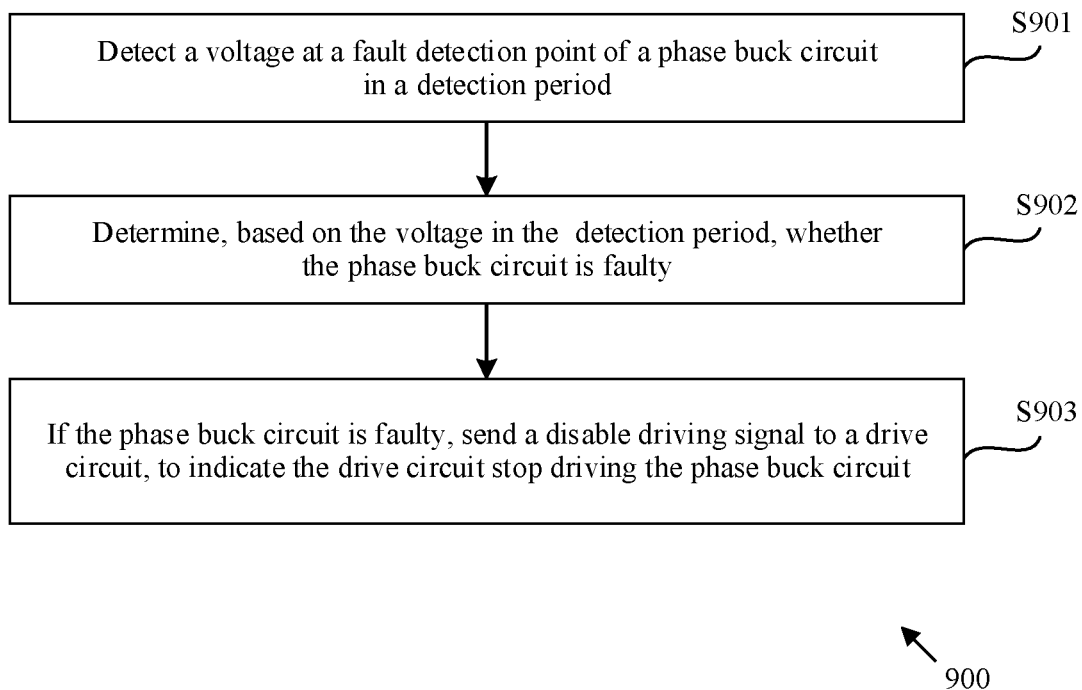
FIG. 9 is a flowchart 900 of a fault detection method of a multi-phase buck converter circuit according to an embodiment of the application.

FIG. 9 is a flowchart 900 of a fault detection method of a multi-phase buck converter circuit according to an embodiment of the application. The following describes a fault detection method for the multi-phase buck converter circuit based on the multi-phase buck converter circuit. The method includes the following steps.

S901: Detect a voltage at a fault detection point of a phase buck circuit in a current detection period.

It should be noted that the phase buck circuit and the detection period are described in the embodiments shown in FIG. 3 to FIG. 8. Therefore, details are not described herein again.

S902: Determine, based on the voltage in the current detection period, whether the phase buck circuit is faulty.

Each detection period may include a first detection moment and a second detection moment, the first detection moment is a moment in a time period in which a first MOS transistor in the particular phase buck circuit is on, and the second detection moment is a moment in a time period in which a second MOS transistor in the particular phase buck circuit is on.

Optionally, the first detection moment is an intermediate moment in the time period in which the first MOS transistor in the particular phase buck circuit is on, or a moment near the intermediate moment; and the second detection moment is an intermediate moment in the time period in which the second MOS transistor in the particular phase buck circuit is on, or a moment near the intermediate moment. In this case, a voltage at the fault detection point obtained at the first detection moment may be a voltage that is relatively stable and accurate in the time period in which the first MOS transistor is on, and a voltage at the fault detection point obtained at the second detection moment may be a voltage that is relatively stable and accurate in the time period in which the second MOS transistor is on. It is clear that the first detection moment may alternatively be another moment in the time period in which the first MOS transistor in the phase buck circuit is on, and the second detection moment may alternatively be another moment in the time period in which the second MOS transistor in the phase buck circuit is on. This is not limited in this embodiment of this application.

In a possible implementation, S902 may include the following step (1) and step (2).

(1) If the voltage at the first detection moment in the current detection period is higher than a first voltage threshold, and the voltage at the second detection moment in the current detection period is lower than a second voltage threshold; or the voltage at the first detection moment in the current detection period is lower than a second voltage threshold, and the voltage at the second detection moment in the current detection period is higher than a first voltage threshold, voltages in M historical detection periods are obtained, where the M historical detection periods and the current detection period are consecutive, and M is a positive integer.

It should be noted that the first voltage threshold may be greater than a half of a voltage of a power supply and less than the voltage of the power supply, that is, the first voltage threshold may be greater than Vin/2 and less than Vin. The second voltage threshold may be less than a half of the voltage of the power supply and greater than zero, that is, the second voltage threshold is less than Vin/2 and greater than zero.

It can be learned from the embodiments in FIG. 2 to FIG. 7 that the first MOS transistor and the fourth MOS transistor may be considered as two equivalent MOS transistors, and the second MOS transistor and the third MOS transistor may be considered as two equivalent MOS transistors. In other words, when either of the first MOS transistor or the fourth MOS transistor is faulty, there is a same change in the voltage at the fault detection point in the detection period. When either of the second MOS transistor or the third MOS transistor is faulty, there is a same change in the voltage at the fault detection point in the detection period.

For ease of description, the following describes a change in the voltage at the fault detection point when the second MOS transistor is faulty and a change in the voltage at the fault detection point when the first MOS transistor is faulty.

Figure 10:
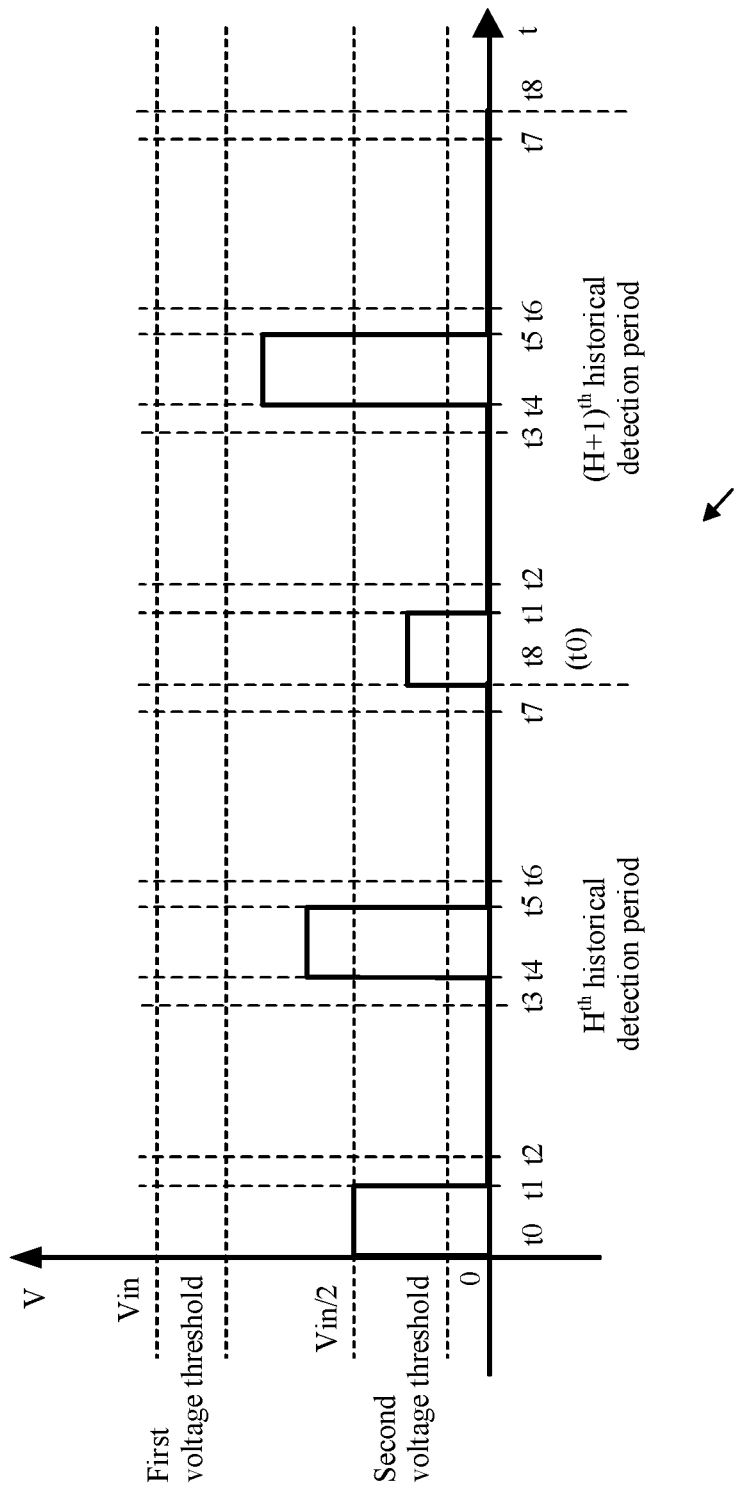
FIG. 10 is a diagram 1000 of a voltage at a fault detection point in the second phase buck circuit 400 according to an embodiment of the application.

FIG. 10 is a diagram 1000 of a voltage at a fault detection point in a second particular phase buck circuit according to an embodiment of the application. In this example, the first MOS transistor is faulty. In a possible case shown in FIG. 10, the first MOS transistor is faulty before a moment t2 in an $H^{th}$ historical detection period before the current detection period, for example, the first MOS transistor is short-circuited. The $H^{th}$ historical detection period may be earlier than the M historical detection periods. In this case, the first MOS transistor may be equivalent to being continuously on. In this case, in a time period from t2 to t3 in the $H^{th}$ historical detection period, the third MOS transistor, the fourth MOS transistor, and the first MOS transistor are on, and the second MOS transistor is off. In this case, the power supply, the first MOS transistor, the third capacitor, and the fourth MOS transistor form a loop. The power supply may charge the third capacitor, and a voltage at a first terminal of the third capacitor increases from Vin/2 to Vin in first duration, where a voltage of a positive electrode of the power supply is Vin. The first duration may be the duration of a single detection period, the duration of a plurality of detection periods, or the first duration may alternatively be duration in another form. This is not limited in this embodiment of this application. After the moment t2, the voltage at the first terminal of the third capacitor is greater than Vin/2, and continuously increases over time. In a time period from t4 to t5 in the $H^{th}$ detection period, the second MOS transistor, the fourth MOS transistor, and the first MOS transistor are on, and the third MOS transistor is off. In this case, the voltage at the fault detection point may be equivalent to the voltage at the first terminal of the third capacitor, that is, the voltage is greater than Vin/2. The voltage at the fault detection point at a second detection moment in the $H^{th}$ historical detection period in some embodiments is greater than Vin/2. In a possible case, the voltage at the fault detection point at the second detection moment in the $H^{th}$ historical detection period is higher than the first voltage threshold. In a time period from t0 to t1 in an $(H+1)^{th}$ historical detection period, the first MOS transistor and the third MOS transistor are on, and the second MOS transistor and the fourth MOS transistor are off. In this case, the voltage at the fault detection point of the second particular phase buck circuit may be equivalent to a voltage at a second terminal of the third capacitor, that is, Vin minus the voltage at the first terminal of the third capacitor. Because the voltage at the first terminal of the third capacitor is greater than Vin/2, Vin minus the voltage at the first terminal of the third capacitor is less than Vin/2, that is, a voltage at the fault detection point at a first detection moment in the $(H+1)^{th}$ historical detection period is less than Vin/2. In a possible case, the voltage at the fault detection point at the first detection moment in the $(H+1)^{th}$ historical detection period is lower than the second voltage threshold. Because the voltage at the first terminal of the third capacitor continuously increases over time, correspondingly the voltage at the second terminal of the third capacitor continuously decreases over time. Therefore, the voltage at the fault detection point of the second particular phase buck circuit at the second detection moment in the $(H+1)^{th}$ historical detection period is greater than Vin/2, and greater than the voltage at the second detection moment in the $H^{th}$ historical detection period.

Figure 11:
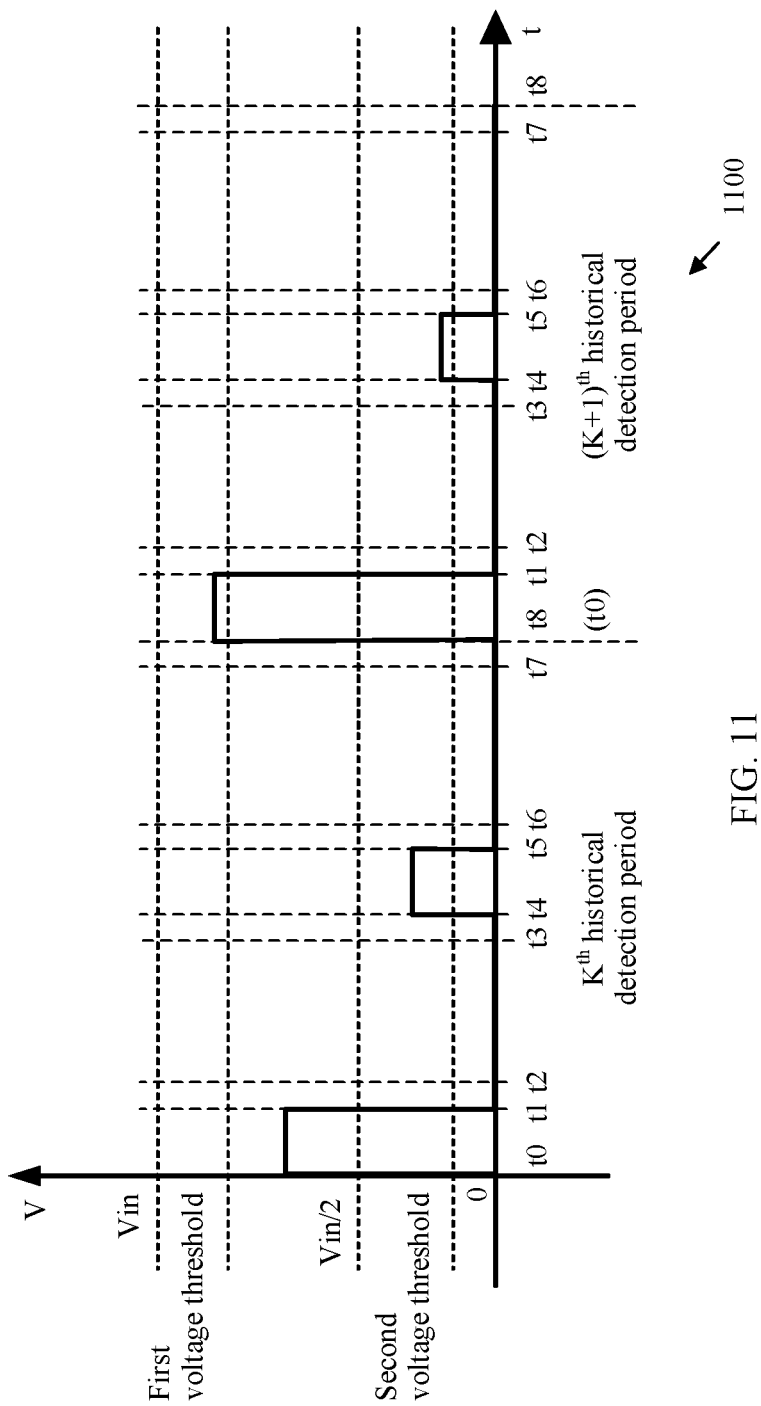
FIG. 11 is a diagram 1100 of a voltage at a fault detection point in the third phase buck circuit 500 according to an embodiment of the application.

FIG. 11 is a diagram 1100 of a voltage at a fault detection point in a third particular phase buck circuit according to an embodiment of the application. In the example shown in FIG. 11, the second MOS transistor is faulty before a moment t0 in a $K^{th}$ historical detection period before the current detection period, for example, the second MOS transistor is short-circuited. The $K^{th}$ historical detection period may be earlier than the M historical detection periods. In this case, the second MOS transistor may be equivalent to being continuously on. In this case, in a time period from t0 to t1 in the $K^{th}$ historical detection period, the first MOS transistor, the third MOS transistor, and the second MOS transistor are on, and the fourth MOS transistor 22 is off. In this case, the third capacitor starts to discharge, a voltage of the third capacitor is less than Vin/2, and the voltage of the third capacitor decreases from Vin/2 to zero in a second duration. In this case, the voltage at the fault detection point may be equal to the voltage of the power supply Vin minus the voltage of the third capacitor, that is, the voltage at the fault detection point is greater than Vin/2. The voltage at the fault detection point at a first detection moment in the $K^{th}$ historical detection period in some embodiments is greater than Vin/2. In a possible case, the voltage at the fault detection point at the first detection moment in the $K^{th}$ historical detection period is higher than the first voltage threshold. In a time period from t4 to t5 in the $K^{th}$ detection period, the second MOS transistor and the fourth MOS transistor are on, and the first MOS transistor and the third MOS transistor are off. In this case, the voltage at the fault detection point is equal to the voltage of the third capacitor, that is, the voltage at the fault detection point is less than Vin/2. A voltage at the fault detection point at a second detection moment in the $K^{th}$ historical detection period in some embodiments is less than Vin/2. In a possible case, the voltage at the fault detection point at the second detection moment in the $K^{th}$ historical detection period is lower than the second voltage threshold. In a historical detection period after the $K^{th}$ historical detection period, a voltage at a first detection moment continuously increases until the voltage increases to Vin, and a voltage at a second detection moment continuously decreases until the voltage decreases to zero.

In conclusion, when the first MOS transistor or the fourth MOS transistor in the particular phase buck circuit is faulty before the current detection period, the voltage at the fault detection point at the first detection moment in the current detection period may be lower than the first voltage threshold, and the voltage at the second detection moment in the current detection period may be higher than the second voltage threshold. When the second MOS transistor or the third MOS transistor in the particular phase buck circuit is faulty before the current detection period, the voltage at the fault detection point at the first detection moment in the current detection period may be higher than the first voltage threshold, and the voltage at the second detection moment in the current detection period may be lower than the second voltage threshold.

(2) If the voltages at the first detection moment in the M historical detection periods are all higher than the first voltage threshold, and the voltages at the second detection moment in the M historical detection periods are all lower than the second voltage threshold; or the voltages at the first detection moment in the M historical detection periods are all lower than the second voltage threshold, and the voltages at the second detection moment in the M historical detection periods are all higher than the first voltage threshold, it is determined that the particular phase buck circuit is faulty; otherwise, it is determined that the particular phase buck circuit is not faulty.

In a possible case, because a voltage of the multi-phase buck converter circuit is unstable or a voltage measured by a detection controller at the fault detection point is inaccurate, voltages at the fault detection point at the first detection moment in a small quantity of time periods are higher than the first voltage threshold, and voltages at the second detection moment are lower than the second voltage threshold; or the voltages at the fault detection point at the first detection moment in the small quantity of time periods are lower than the second voltage threshold, and the voltages at the second detection moment are higher than the first voltage threshold. Therefore, if the voltage at the first detection moment in the current detection period is higher than the first voltage threshold, and the voltage at the second detection moment in the current detection period is lower than the second voltage threshold; or the voltage at the first detection moment in the current detection period is lower than the second voltage threshold, and the voltage at the second detection moment in the current detection period is higher than the first voltage threshold, there is a possibility that the particular phase buck circuit is incorrectly determined as faulty. Therefore, the voltages in the M historical detection periods may be obtained, where the M historical detection periods and the current detection period are consecutive, and then whether the particular phase buck circuit is faulty is determined based on the voltages at the first detection moment and the second detection moment in the M historical detection periods, so that fault detection for the particular phase buck circuit can be more accurate.

In a possible implementation, S902 may include the following step A and step B.

Step A: If the voltage at the first detection moment in the current detection period is higher than a first voltage threshold, and the voltage at the second detection moment in the current detection period is lower than a second voltage threshold; or the voltage at the first detection moment in the current detection period is lower than the second voltage threshold, and the voltage at the second detection moment in the current detection period is higher than the first voltage threshold, voltages in M historical detection periods are obtained, where the M historical detection periods and the current detection period are consecutive, and M is a positive integer.

It should be noted that the first voltage threshold and the second voltage threshold are described in the foregoing step (1). Therefore, details are not described herein again.

Step B: Determine a voltage difference between the voltage at the first detection moment and the voltage at the second detection moment in the current detection period, and determine a voltage difference between the voltage at the first detection moment and the voltage at the second detection moment in each historical detection period, to obtain M+1 voltage differences. If the M+1 voltage differences are all greater than a third voltage threshold, determine that the particular phase buck circuit is faulty; otherwise, determine that the particular phase buck circuit is not faulty.

It should be noted that the third voltage threshold may be less than the voltage of the power supply and greater than zero, and the third voltage threshold may be preset based on a use requirement. This is not limited in this embodiment of this application. For example, the third voltage threshold may be 1 V or 2 V. In addition, because the voltages at the first detection moment may be higher than the voltages at the second detection moment in the current detection period and in each historical detection period, or the voltages at the first detection moment may be less than the voltages at the second detection moment in the current detection period and in each historical detection period, the M+1 voltage differences may be an absolute value of the voltage difference between the voltage at the first detection moment and the voltage at the second detection moment in the current detection period, and an absolute value of the voltage difference between the voltage at the first detection moment and the voltage at the second detection moment in each historical detection period. When the particular phase buck circuit is not faulty, a voltage at the first detection moment and a voltage at the second detection moment of the particular phase buck circuit in one detection period may be equal, or a voltage difference between the two voltages is less than the third voltage threshold due to an error or the like. Therefore, when all the M+1 voltage differences are greater than the third voltage threshold, it may be determined that the particular phase buck circuit is faulty.

In a possible implementation, S902 may further include the following step a and step b.

Step a: If the voltage at the first detection moment in the current detection period is higher than a first voltage threshold, and the voltage at the second detection moment in the current detection period is lower than a second voltage threshold; or the voltage at the first detection moment in the current detection period is lower than a second voltage threshold, and the voltage at the second detection moment in the current detection period is higher than a first voltage threshold, obtain a voltage in a detection period that is in a time window.

It should be noted that the time window is used to indicate a time period that starts from the current detection period and that is earlier than reference duration of the current detection period. The time window may include a plurality of consecutive historical detection periods that start from the current detection period and that are earlier than the current detection period, and the time window may move as the current detection period proceeds. For example, a time window of a next detection period of the current detection period is used to indicate a time period that starts from the next detection period of the current detection period and that is earlier than reference duration of the next detection period of the current detection period. The reference duration may be preset based on a use requirement. This is not limited in this embodiment of this application.

Step b: If a voltage at the first detection moment in each detection period in the time window is higher than the first voltage threshold, and a voltage at the second detection moment in each detection period in the time window is lower than the second voltage threshold; or the voltage at the first detection moment in each detection period in the time window is lower than the second voltage threshold, and the voltage at the second detection moment in each detection period in the time window is higher than the first voltage threshold, determine that the particular phase buck circuit is faulty; otherwise, determine that the particular phase buck circuit is not faulty.

Because the time window may include the plurality of consecutive historical detection periods that start from the current detection period and that are earlier than the current detection period, and the time window may move as the current detection period proceeds, the voltage at the first detection moment and the voltage at the second detection moment in each detection period in the time window are detected, so that fault detection for the particular phase buck circuit is more efficient and more stable.

In a possible implementation, S902 may further include the following step (1) and step (2).

(1) If the voltage at the first detection moment in the current detection period is higher than a first voltage threshold, and the voltage at the second detection moment in the current detection period is lower than a second voltage threshold; or the voltage at the first detection moment in the current detection period is lower than a second voltage threshold, and the voltage at the second detection moment in the current detection period is higher than a first voltage threshold, a voltage in a detection period that is in a time window is obtained.

It should be noted that, for the time window, refer to the description of the time window in the foregoing step a. Details are not described herein again.

(2) Determine a voltage difference between a voltage at the first detection moment and a voltage at the second detection moment in each detection period in the time window, to obtain a plurality of voltage differences; and if the plurality of voltage differences are greater than the third voltage threshold, determine that the particular phase buck circuit is faulty; otherwise, determine that the particular phase buck circuit is not faulty.

It should be noted that, for the voltage difference, refer to the description of the voltage difference in the foregoing step B. Details are not described herein again.

S903: If the particular phase buck circuit is currently faulty, send a disable driving signal to the drive circuit, to indicate the drive circuit to stop driving the particular phase buck circuit.

It should be noted that, after stopping driving the particular phase buck circuit, the drive circuit may alternately drive another buck circuit other than the particular phase buck circuit to be on and off, to continuously supply power to a load. In other words, stopping driving the particular phase buck circuit does not affect normal working of the multi-phase buck converter circuit.

In this embodiment of this application, a voltage at a fault detection point of a particular phase buck circuit in a current detection period is first detected. Because the fault detection point of the particular phase buck circuit corresponds to different voltages at different time points, whether the particular phase buck circuit is currently faulty may be determined based on the voltage in the current detection period. If the particular phase buck circuit is currently faulty, the disable driving signal is sent to the drive circuit, to indicate the drive circuit to stop driving the particular phase buck circuit. This implements isolation of the particular phase buck circuit, and avoids a case in which the load cannot work normally because the particular phase buck circuit is faulty. In addition, in this application, because the particular phase buck circuit is any one of the N phase buck circuits, a voltage at a fault detection point of each phase buck circuit may be detected synchronously, to synchronously determine whether each phase buck circuit is faulty, so that fault detection of the N phase buck circuits is more efficient.

Figure 12:
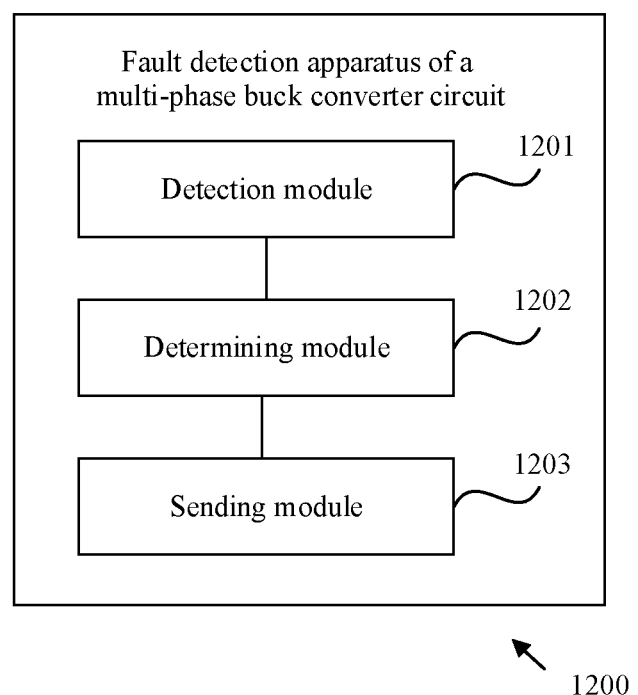
FIG. 12 is a diagram 1200 of a fault detection apparatus of a multi-phase buck converter circuit according to an embodiment of the application.

FIG. 12 is a diagram of a fault detection apparatus 1200 of a multi-phase buck converter circuit according to an embodiment of the application. The apparatus includes a detection module 1201, a determining module 1202, and a sending module 1203.

The detection module 1201 is configured to perform the S901 operation 1.

The determining module 1202 is configured to perform the S902 operation.

The sending module 1203 is configured to perform the S903 operation.

Optionally, each detection period includes a first detection moment and a second detection moment, the first detection moment is a moment in a time period in which a first MOS transistor of a phase buck circuit is on, and the second detection moment is a moment in a time period in which a second MOS transistor in the phase buck circuit is on.

The determining module 1202 includes:

a first obtaining submodule, configured to: if a voltage at the first detection moment in a detection period is higher than a first voltage threshold, and a voltage at the second detection moment in the detection period is lower than a second voltage threshold; or a voltage at the first detection moment in a detection period is lower than a second voltage threshold, and a voltage at the second detection moment in the detection period is higher than a first voltage threshold, obtain voltages in M historical detection periods, where the M historical detection periods and the detection period are consecutive, M is a positive integer, the first voltage threshold is greater than a half of a voltage of a power supply and less than the voltage of the power supply, and the second voltage threshold is less than a half of the voltage of the power supply and greater than zero; and a first determining submodule, configured to: if the voltages at the first detection moment in the M historical detection periods are all higher than the first voltage threshold, and the voltages at the second detection moment in the M historical detection periods are all lower than the second voltage threshold; or the voltages at the first detection moment in the M historical detection periods are all lower than the second voltage threshold, and the voltages at the second detection moment in the M historical detection periods are all higher than the first voltage threshold, determine that the phase buck circuit is faulty; otherwise, determine that the phase buck circuit is not faulty.

Optionally, each detection period includes a first detection moment and a second detection moment, the first detection moment is a moment in a time period in which a first MOS transistor of a phase buck circuit is on, and the second detection moment is a moment in a time period in which a second MOS transistor in the phase buck circuit is on.

The determining module 1202 includes:

a second obtaining submodule, configured to: if a voltage at the first detection moment in the detection period is higher than a first voltage threshold, and a voltage at the second detection moment in the detection period is lower than a second voltage threshold; or the voltage at the first detection moment in the detection period is lower than a second voltage threshold, and the voltage at the second detection moment in the detection period is higher than a first voltage threshold, obtain voltages in M historical detection periods, where the M historical detection periods and the detection period are consecutive, M is a positive integer, the first voltage threshold is greater than a half of a voltage of a power supply and less than the voltage of the power supply, and the second voltage threshold is less than a half of the voltage of the power supply and greater than zero;

a second determining submodule, configured to: determine a voltage difference between the voltage at the first detection moment and the voltage at the second detection moment in the detection period, and determine a voltage difference between the voltage at the first detection moment and the voltage at the second detection moment in each historical detection period, to obtain M+1 voltage differences; and a third determining submodule, configured to: if the M+1 voltage differences are all greater than a third voltage threshold, determine that the phase buck circuit is faulty; otherwise, determine that the phase buck circuit is not faulty, where the third voltage threshold is less than the voltage of the power supply and is greater than zero.

Optionally, each detection period includes a first detection moment and a second detection moment, the first detection moment is a moment in a time period in which a first MOS transistor of a phase buck circuit is on, and the second detection moment is a moment in a time period in which a second MOS transistor in the phase buck circuit is on.

The determining module 1202 includes:

a third obtaining submodule, configured to: if a voltage at the first detection moment in the detection period is higher than a first voltage threshold, and a voltage at the second detection moment in the detection period is lower than a second voltage threshold; or the voltage at the first detection moment in the detection period is lower than a second voltage threshold, and the voltage at the second detection moment in the detection period is higher than a first voltage threshold, obtain a voltage in a detection period that is in a time window, where the time window is used to indicate a time period that starts from the detection period and that is earlier than reference duration of the detection period; and a fourth determining submodule, configured to: if a voltage at the first detection moment in each detection period in the time window is higher than the first voltage threshold, and a voltage at the second detection moment in each detection period in the time window is lower than the second voltage threshold; or the voltage at the first detection moment in each detection period in the time window is lower than the second voltage threshold, and the voltage at the second detection moment in each detection period in the time window is higher than the first voltage threshold, determine that the phase buck circuit is faulty; otherwise, determine that the phase buck circuit is not faulty, where the first voltage threshold is greater than a half of a voltage of a power supply and less than the voltage of the power supply, and the second voltage threshold is less than a half of the voltage of the power supply and greater than zero.

Optionally, each detection period includes a first detection moment and a second detection moment, the first detection moment is a moment in a time period in which a first MOS transistor of a phase buck circuit is on, and the second detection moment is a moment in a time period in which a second MOS transistor in the phase buck circuit is on.

The determining module 1202 includes:

a fourth obtaining submodule, configured to: if a voltage at the first detection moment in the detection period is higher than a first voltage threshold, and a voltage at the second detection moment in the detection period is lower than a second voltage threshold; or the voltage at the first detection moment in the detection period is lower than the second voltage threshold, and the voltage at the second detection moment in the detection period is higher than the first voltage threshold, obtain a voltage in a detection period that is in a time window, where the time window is used to indicate a time period that starts from the detection period and that is earlier than reference duration of the detection period, the first voltage threshold is greater than a half of a voltage of a power supply and less than the voltage of the power supply, and the second voltage threshold is less than a half of the voltage of the power supply and greater than zero;

a fifth determining submodule, configured to determine a voltage difference between a voltage at the first detection moment and a voltage at the second detection moment in each detection period in the time window, to obtain a plurality of voltage differences; and a sixth determining submodule, configured to: if the plurality of voltage differences are all greater than a third voltage threshold, determine that the phase buck circuit is faulty; otherwise, determine that the phase buck circuit is not faulty, where the third voltage threshold is less than the voltage of the power supply and is greater than zero.

In the embodiments of this application, the voltage at the fault detection point of the phase buck circuit in the detection period is first detected. Because the fault detection point of the phase buck circuit corresponds to different voltages at different time points, whether the phase buck circuit is faulty may be determined based on the voltage in the detection period. If the phase buck circuit is faulty, the disable driving signal is sent to the drive circuit, to indicate the drive circuit to stop driving the phase buck circuit. This implements isolation of the phase buck circuit, and avoids a case in which the load cannot work normally because the phase buck circuit is faulty. In addition, in this application, because the phase buck circuit is any one of the N phase buck circuits, the voltage at the fault detection point of each phase buck circuit may be detected synchronously, to synchronously determine whether each phase buck circuit is faulty, so that fault detection of the phase buck circuits is more efficient.

It should be noted that, when the fault detection apparatus of the multi-phase buck converter circuit provided in the foregoing embodiment performs fault detection on the multi-phase buck converter circuit, division into the foregoing functional modules is merely used as an example for description. During actual application, the foregoing functions may be allocated to different functional modules for implementation based on a requirement. To be specific, an internal structure of the apparatus is divided into different functional modules, to implement all or some of the functions described above. In addition, the fault detection apparatus of the multi-phase buck converter circuit provided in the foregoing embodiment and the method embodiments pertain to a same concept. For a specific implementation process thereof, refer to the method embodiments. Details are not described herein again.

All or some of the foregoing embodiments may be implemented by using software, hardware, firmware, or any combination thereof. When software is used for implementation, all or some of the embodiments may be implemented in a form of a computer program product. The computer program product includes one or more computer instructions. When the computer instructions are loaded and executed on a computer, the procedures or functions according to the embodiments of this application are all or partially generated. The computer may be a general-purpose computer, a dedicated computer, a computer network, or another programmable apparatus.

The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or may be a data storage device, such as a server or a data center, integrating one or more usable media. The usable medium may be a magnetic medium (for example, a floppy disk, a hard disk, or a magnetic tape), an optical medium (for example, a digital versatile disc (DVD)), a semiconductor medium (for example, a solid-state disk (SSD)), or the like.

The foregoing descriptions are embodiments provided in this application, but are not intended to limit this application. Any modification, equivalent replacement, or improvement made without departing from the principle of this application shall fall within the protection scope of this application.

What is claimed is:

1. A multi-phase buck converter circuit, comprising:
a power supply;
a plurality of phase buck circuits, each phase buck circuit of the plurality of phase buck circuits including:
an input terminal;
an output terminal; and
a second input terminal, with the input terminal and the second input terminal of the each phase buck circuit of the plurality of phase buck circuits being coupled to the power supply;
a third capacitor;
an inductor;
a first MOS transistor, with a drain of the first MOS transistor connected to the power supply;
a second MOS transistor, with a source of the first MOS transistor connected to a drain of the second MOS transistor and to a first terminal of the third capacitor;
a third MOS transistor, with a source of the second MOS transistor is connected to a drain of the third MOS transistor and to a first terminal of the inductor;
a fourth MOS transistor, with a source of the third MOS transistor is connected to a drain of the fourth MOS transistor and to a second terminal of the third capacitor and wherein a source of the fourth MOS transistor is connected to ground; and
a fault detection point comprising a connection point between the source of the second MOS transistor and the drain of the third MOS transistor;
a plurality of inductors coupled to the output terminals of the plurality of phase buck circuits, the plurality of inductors providing an output voltage at an output of the multi-phase buck converter circuit;
a detection controller coupled to the output terminals of the plurality of phase buck circuits, the detection controller configured to detect a fault in the plurality of phase buck circuits; and
a drive circuit coupled to the detection controller and coupled to each second input terminal of the plurality of phase buck circuits, the drive circuit configured to detect a faulty phase buck circuit and stop driving the faulty phase buck circuit.

2. The multi-phase buck converter circuit according to claim 1, wherein the plurality of phase buck circuits comprises N phase buck circuits and the drive circuit comprises N drive subcircuits in one-to-one correspondence with the N phase buck circuits; and
input terminals of the N drive subcircuits are connected to an output terminal of the detection controller, and output terminals of the N drive subcircuits are connected to the second input terminals of the corresponding N phase buck circuits.

3. The multi-phase buck converter circuit according to claim 1, wherein the plurality of phase buck circuits comprises N phase buck circuits and the drive circuit comprises N drive subcircuits in one-to-one correspondence with the N phase buck circuits; and
  input terminals of the N drive subcircuits are connected to an output terminal of the detection controller, and output terminals of the N drive subcircuits are connected to the second input terminals of the corresponding N phase buck circuit.

4. The multi-phase buck converter circuit according to claim 1, wherein the multi-phase buck converter circuit comprises a network device.

5. A fault detection method of a multi-phase buck converter circuit, the method comprising:
  detecting a fault detection point voltage at a fault detection point of a phase buck circuit in a detection period, the detection period comprising a first detection moment and a second detection moment, the first detection moment comprising a time period in which a first MOS transistor in the phase buck circuit is on, and the second detection moment comprising a time period in which a second MOS transistor in the phase buck circuit is on;
  determining, based on the fault detection point voltage in the detection period, that the phase buck circuit is faulty, the determining comprising:
    if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtaining voltages in M historical detection periods, wherein the M historical detection periods and the current detection period are consecutive, M is a positive integer, the first voltage threshold is greater than half of a voltage of the power supply and less than the voltage of the power supply, and the second voltage threshold is less than the half of the voltage of the power supply and greater than zero; or
    if the voltages at the first detection moment in the M historical detection periods are all higher than the first voltage threshold and the voltages at the second detection moment in the M historical detection periods are all lower than the second voltage threshold, or the voltages at the first detection moment in the M historical detection periods are all lower than the second voltage threshold and the voltages at the second detection moment in the M historical detection periods are all higher than the first voltage threshold, determining that the phase buck circuit is faulty; otherwise, determining that the current-phase buck circuit is not faulty; and
  if the phase buck circuit is faulty, sending a disable driving signal to the drive circuit, to indicate the drive circuit stop driving the phase buck circuit.

6. The method according to claim 5, wherein the detection period comprises a first detection moment and a second detection moment, the first detection moment is a time period in which a first MOS transistor in the phase buck circuit is on, and the second detection moment is a time period in which a second MOS transistor in the phase buck circuit is on; and
  the determining, based on the voltage in the current detection period, whether the phase buck circuit is currently faulty comprises:
  if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtaining voltages in M historical detection periods, wherein the M historical detection periods and the current detection period are consecutive, M is a positive integer, the first voltage threshold is greater than a half of a voltage of the power supply and less than the voltage of the power supply, and the second voltage threshold is less than the half of the voltage of the power supply and greater than zero;
  determining a voltage difference between the voltage at the first detection moment and the voltage at the second detection moment in the current detection period, and determining a voltage difference between the voltage at the first detection moment and the voltage at the second detection moment in each historical detection period, to obtain M+1 voltage differences; and
  if the M+1 voltage differences are all greater than a third voltage threshold, determining that the phase buck circuit is faulty; otherwise, determining that the phase buck circuit is not faulty, wherein the third voltage threshold is less than the voltage of the power supply and greater than zero.

7. The method according to claim 5, wherein the detection period comprises a first detection moment and a second detection moment, the first detection moment is a time period in which a first MOS transistor in the phase buck circuit is on, and the second detection moment is a time period in which a second MOS transistor in the phase buck circuit is on; and
  the determining, based on the voltage in the current detection period, whether the phase buck circuit is currently faulty comprises:
  if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtaining voltages in detection periods that are in a time window, the time window indicating a time period that starts from the current detection period and that is earlier than a reference duration of the current detection period; and
  if the voltage at the first detection moment in each detection period in the time window is higher than the first voltage threshold and the voltage at the second detection moment in each detection period in the time window is lower than the second voltage threshold, or the voltage at the first detection moment in each detection period in the time window is lower than the second voltage threshold and the voltage at the second detection moment in each detection period in the time window is higher than the first voltage threshold, determining that the phase buck circuit is faulty; otherwise, determining that the phase buck circuit is not faulty, wherein the first voltage threshold is greater than a half of a voltage of the power supply and less than the voltage of the power supply, and the second voltage threshold is less than the half of the voltage of the power supply and greater than zero.

8. The method according to claim 5, wherein the detection period comprises a first detection moment and a second detection moment, the first detection moment is a moment in a time period in which a first MOS transistor in the phase buck circuit is on, and the second detection moment is a moment in a time period in which a second MOS transistor in the phase buck circuit is on; and the determining, based on the voltage in the current detection period, whether the phase buck circuit is currently faulty comprises:

if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtaining voltages in detection periods that are in a time window, the time window indicating a time period that starts from the current detection period and that is earlier than a reference duration of the current detection period, the first voltage threshold is greater than a half of a voltage of the power supply and less than the voltage of the power supply, and the second voltage threshold is less than the half of the voltage of the power supply and greater than zero;

determining a voltage difference between the voltage at the first detection moment and the voltage at the second detection moment in each detection period in the time window, to obtain a plurality of voltage differences; and if the plurality of voltage differences are all greater than a third voltage threshold, determining that the phase buck circuit is faulty; otherwise, determining that the phase buck circuit is not faulty, wherein the third voltage threshold is less than the voltage of the power supply and greater than zero.

9. A fault detection apparatus of a multi-phase buck converter circuit, configured to perform fault detection on the multi-phase buck converter circuit, wherein the apparatus comprises:

a detection module configured to detect a voltage at a fault detection point of a phase buck circuit in a detection period, the detection period comprising a first detection moment and a second detection moment, the first detection moment comprising a time period in which a first MOS transistor in the phase buck circuit is on, and the second detection moment comprising a time period in which a second MOS transistor in the phase buck circuit is on;

a determining module configured to determine, based on the voltage in the current detection period, whether the phase buck circuit is faulty, the determining module comprising:

a first obtaining submodule configured to, if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtain voltages in M historical detection periods, wherein the M historical detection periods and the current detection period are consecutive, M is a positive integer, the first voltage threshold is greater than a half of a voltage of a power supply and less than the voltage of the power supply, and the second voltage threshold is less than the half of the voltage of the power supply and greater than zero; and a first determining submodule configured to, if the voltages at the first detection moment in the M historical detection periods are all higher than the first voltage threshold, and the voltages at the second detection moment in the M historical detection periods are all lower than the second voltage threshold, or the voltages at the first detection moment in the M historical detection periods are all lower than the second voltage threshold, and the voltages at the second detection moment in the M historical detection periods are all higher than the first voltage threshold, determine that the phase buck circuit is faulty; otherwise determine that the phase buck circuit is not faulty; and a sending module configured to, if the phase buck circuit is faulty, send a disable driving signal to the drive circuit indicating the drive circuit stop driving the phase buck circuit.

10. The apparatus according to claim 9, wherein the detection period comprises a first detection moment and a second detection moment, the first detection moment is a time period in which a first MOS transistor in the phase buck circuit is on, and the second detection moment is a time period in which a second MOS transistor in the phase buck circuit is on; and the determining module comprises:

a second obtaining submodule configured to: if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtain voltages in M historical detection periods, wherein the M historical detection periods and the current detection period are consecutive, M is a positive integer, the first voltage threshold is greater than a half of a voltage of a power supply and less than the voltage of the power supply, and the second voltage threshold is less than the half of the voltage of the power supply and greater than zero;

a second determining submodule configured to: determine a voltage difference between the voltage at the first detection moment and the voltage at the second detection moment in the current detection period, and determine a voltage difference between the voltage at the first detection moment and the voltage at the second detection moment in each historical detection period, to obtain M+1 voltage differences; and a third determining submodule configured to: if the M+1 voltage differences are all greater than a third voltage threshold, determine that the phase buck circuit is faulty; otherwise, determine that the phase buck circuit is not faulty, wherein the third voltage threshold is less than the voltage of the power supply and greater than zero.

11. The apparatus according to claim 9, wherein the detection period comprises a first detection moment and a second detection moment, the first detection moment is a time period in which a first MOS transistor in the phase buck circuit is on, and the second detection moment is a time period in which a second MOS transistor in the phase buck circuit is on; and the determining module comprises:
a third obtaining submodule configured to: if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtain a voltage in a detection period that is in a time window, the time window indicating a time period that starts from the current detection period and that is earlier than a reference duration of the current detection period; and a fourth determining submodule configured to: if a voltage at the first detection moment in each detection period in the time window is higher than the first voltage threshold and a voltage at the second detection moment in each detection period in the time window is lower than the second voltage threshold, or the voltage at the first detection moment in each detection period in the time window is lower than the second voltage threshold and the voltage at the second detection moment in each detection period in the time window is higher than the first voltage threshold, determine that the phase buck circuit is faulty; otherwise, determine that the phase buck circuit is not faulty, wherein the first voltage threshold is greater than a half of a voltage of a power supply and less than the voltage of the power supply, and the second voltage threshold is less than the half of the voltage of the power supply and greater than zero.

12. The apparatus according to claim 9, wherein the detection period comprises a first detection moment and a second detection moment, the first detection moment is a time period in which a first MOS transistor in the phase buck circuit is on, and the second detection moment is a time period in which a second MOS transistor in the phase buck circuit is on; and the determining module comprises:
a fourth obtaining submodule configured to: if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtain a voltage in a detection period that is in a time window, wherein the time window is used to indicate the time period that starts from the current detection period and that is earlier than a reference duration of the current detection period, the first voltage threshold is greater than a half of a voltage of a power supply and less than the voltage of the power supply, and the second voltage threshold is less than the half of the voltage of the power supply and greater than zero;

a fifth determining submodule configured to determine a voltage difference between a voltage at the first detection moment and a voltage at the second detection moment in each detection period in the time window, to obtain a plurality of voltage differences; and a sixth determining submodule configured to: if the plurality of voltage differences are greater than a third voltage threshold, determine that the phase buck circuit is faulty; otherwise, determine that the phase buck circuit is not faulty, wherein the third voltage threshold is less than the voltage of the power supply and greater than zero.

13. A non-transitory computer-readable storage medium comprising program code, wherein when the program code is run on a computer, the computer is enabled to perform the fault detection method comprising:

detecting a fault detection point voltage at a fault detection point of a phase buck circuit in a detection period, the detection period comprising a first detection moment and a second detection moment, the first detection moment comprising a time period in which a first MOS transistor in the phase buck circuit is on, and the second detection moment comprising a time period in which a second MOS transistor in the phase buck circuit is on;

determining, based on the fault detection point voltage in the detection period, that the phase buck circuit is faulty, the determining comprising:
if a voltage at the first detection moment in the current detection period is higher than a first voltage threshold and a voltage at the second detection moment in the current detection period is lower than a second voltage threshold, or the voltage at the first detection moment in the current detection period is lower than the second voltage threshold and the voltage at the second detection moment in the current detection period is higher than the first voltage threshold, obtaining voltages in M historical detection periods, wherein the M historical detection periods and the current detection period are consecutive, M is a positive integer, the first voltage threshold is greater than half of a voltage of the power supply and less than the voltage of the power supply, and the second voltage threshold is less than the half of the voltage of the power supply and greater than zero; or if the voltages at the first detection moment in the M historical detection periods are all higher than the first voltage threshold and the voltages at the second detection moment in the M historical detection periods are all lower than the second voltage threshold, or the voltages at the first detection moment in the M historical detection periods are all lower than the second voltage threshold and the voltages at the second detection moment in the M historical detection periods are all higher than the first voltage threshold, determining that the phase buck circuit is faulty; otherwise, determining that the current-phase buck circuit is not faulty; and if the phase buck circuit is faulty, sending a disable driving signal to the drive circuit to indicate the drive circuit stop driving the phase buck circuit.

* * * * *